United States Patent
Kub et al.

[11] Patent Number: 6,153,495
[45] Date of Patent: Nov. 28, 2000

[54] ADVANCED METHODS FOR MAKING SEMICONDUCTOR DEVICES BY LOW TEMPERATURE DIRECT BONDING

[75] Inventors: Francis J. Kub, Arnold, Md.; Victor Temple, Clifton Park, N.Y.; Karl Hobart, Upper Marlboro, Md.; John Neilson, Norristown, Pa.

[73] Assignee: Intersil Corporation, Palm Bay, Fla.

[21] Appl. No.: 09/036,815

[22] Filed: Mar. 9, 1998

[51] Int. Cl.⁷ .................................................. H01L 21/30
[52] U.S. Cl. .......................... 438/459; 438/795; 438/977; 438/473
[58] Field of Search .............................. 438/58, 143, 310, 438/406, 455, 459, 471, 473, 474, 477, 795, 977

[56] References Cited

U.S. PATENT DOCUMENTS

| | | |
|---|---|---|
| 4,977,438 | 12/1990 | Abbas . |
| 4,994,884 | 2/1991 | Kato et al. . |
| 5,027,180 | 6/1991 | Nishizawa et al. . |
| 5,162,241 | 11/1992 | Mori . |
| 5,207,864 | 5/1993 | Bhat et al. . |
| 5,240,876 | 8/1993 | Gaul et al. . |
| 5,270,230 | 12/1993 | Sakurai . |
| 5,323,059 | 6/1994 | Rutter et al. . |
| 5,376,580 | 12/1994 | Kish et al. . |
| 5,426,314 | 6/1995 | Nishizawa et al. . |
| 5,459,339 | 10/1995 | Sakurai et al. . |
| 5,483,487 | 7/1998 | Weeks et al. ............................ 438/685 |
| 5,493,134 | 2/1996 | Mehrotra et al. . |
| 5,506,153 | 4/1996 | Brunner et al. . |
| 5,541,122 | 7/1996 | Tu et al. . |
| 5,608,237 | 3/1997 | Aizawa et al. . |
| 5,654,583 | 8/1997 | Okuno et al. . |
| 5,783,477 | 7/1998 | Kish, Jr. et al. . |
| 5,952,694 | 9/1999 | Miyawali et al. . |

*Primary Examiner*—Savitri Mulpuri
*Attorney, Agent, or Firm*—Allen, Dyer, Doppelt, Milbrath & Gilchrist, P.A.

[57] ABSTRACT

A method for making a semiconductor device from a plurality of semiconductor substrates includes the steps of: processing at least one surface of at least one of the substrates; thinning at least one of the substrates; bonding the processed and thinned substrates together so that the at least one processed surface defines an outer surface of the semiconductor device; and annealing the bonded together substrates at a relatively low anneal temperature so as to not adversely effect the at least one processed surface. The step of thinning preferably comprises removing a surface portion of the least one substrate opposite the processed surface, to a thickness of less than about 200 $\mu$m. A gettering layer may be formed for the at least one substrate prior to thinning. Accordingly, the step of thinning removes the gettering layer. An implanted region may be formed at a surface of the at least one substrate opposite the processed surface prior to bonding. The implanting may comprise implanting with a lifetime killing implant or a dopant. An epitaxial layer may be formed on the backside of a substrate. The step of processing may include forming a metal layer. Thus, the anneal temperature is preferably less than a temperature related to a characteristic of the metal layer. For an aluminum layer, the anneal temperature is preferably less than about 450° C. If a barrier metal is used between the aluminum and substrate, the anneal temperature may be in a range of about 450 to 550° C.

83 Claims, 10 Drawing Sheets

ADVANCED METHODS FOR MAKING SEMICONDUCTOR DEVICES BY LOW TEMPERATURE DIRECT BONDING

GOVERNMENT LICENSE RIGHTS

The U.S. Government has a paid-up license in this invention and the right in limited circumstances to require the patent owner to license others on reasonable terms as provided for by the terms of Contract No. N00024-94-C-4088 awarded by the Navy.

FIELD OF THE INVENTION

The present invention relates to the field of semiconductors, and, more particularly, to a method of fabricating power semiconductor devices or circuits, and the devices produced by the method.

BACKGROUND OF THE INVENTION

Electronic power switching devices are widely used in many applications, such as, for example, motor controls, inverters, line switches, pulse circuits, and other power switching applications. A silicon controlled rectifier (SCR) or thyristor is a bistable semiconductor switching device formed from four layers of silicon. One type of power switching device, the MOS controlled thyristor (MCT) is especially suited for resonant (zero voltage or zero current switching applications. The MCT has a forward voltage drop much like the SCR, and therefore enjoys greatly reduced conduction power loss. The MCT allows the control of high power circuits with very small amounts of input energy—a feature common to SCRs as well. In an MCT, turn-off is accomplished by turning on a highly interdigitated off-FET to short out one or both of the emitter-base junctions of a thyristor.

Another advantageous power switching device is the insulated gate bipolar transistor (IGBT) which is designed for high voltage, low on-dissipation applications, such as switching regulators and motor drivers. The IGBT can be operated from low power integrated circuits. The IGBT is also an insulated gate, field controlled switching device like the MCT. Available MCTs and IGBTs are useful at high switching frequency than is generally practice with power Darlington transistors, for example. In addition, both may be operated with junction temperatures of 150° C. and above, and operate in switching circuits having 600 volts or higher switch ratings.

One approach to fabricating power switching devices involves direct semiconductor—semiconductor wafer bonding. The wafer bonding has been for the purpose of replacing a thick, e.g. 100 $\mu$m epitaxial layer growth. For this bonding application, high temperature bonding anneals at temperatures of greater than about 1100° C. are typically used to remove microvoids and bubbles. Both hydrophobic and hydrophilic bonding has been used.

Recently there has been increasing interest in the possibility of fabricating switching power devices with MOSFET current control devices on both the front side and back side of the power device to achieve faster turnoff of the device such as disclosed in U.S. Pat. No. 4,977,438 to Abbas. The conventional approach for fabricating double-sided MOSFET controlled power devices is to perform processing and photosteps on both sides of the wafer. This approach required critical control of thermal budgets, has approximately a factor of two increase in fabrication steps, and increases the possibility of yield loss due to scratches, etc.

U.S. Pat. No. 5,541,122 to Tu et al., for example, discloses a fabrication method for IGBT wherein two wafers are bonded together, and annealed at a temperature in a range of 800 to 1100° C. An N-type wafer is doped N+ at a surface thereof and is bonded to a P+ wafer to define an N+ buffer region for the IGBT. Thereafter, a gate is formed on the upper surface and various diffusions are also made adjacent the gate to define an emitter/collector encircling the gate. An emitter contact is formed on the diffusions and a collector contact is deposited on the lower surface of the wafer using conventional techniques.

Unfortunately, the relatively high temperature annealing and subsequent device processing steps may adversely affect the doping profile of the buffer layer. Accordingly, the turnoff speed may be reduced. In addition, the double-sided processing after annealing requires a relatively large number of process steps, and the substrates are subject to mechanical damage which may reduce yields.

SUMMARY OF THE INVENTION

In view of the foregoing background, it is therefore an object of the present invention to provide advanced methods for forming power devices or circuits with reduced process steps and/or improved device quality.

These and other objects, advantages and features in accordance with the present invention are provided by a method for making a semiconductor device from a plurality of semiconductor substrates, and wherein one embodiment of the invention comprises the steps of: processing at least one surface of at least one of the substrates; thinning at least one of the substrates; bonding the substrates together so that the at least one processed surface defines an outer surface of the semiconductor device; and annealing the bonded together substrates at a relatively low anneal temperature so as to not adversely effect the at least one processed surface. The step of thinning preferably comprises removing a surface portion of the least one substrate opposite the processed surface, to a thickness of less than about 200 $\mu$m. The surface may also be polished to a predetermined surface roughness.

One aspect of the invention relates to forming a gettering layer for the at least one substrate prior to thinning. Accordingly, the step of thinning removes the gettering layer. The step of forming the gettering layer may include performing at least one of a phosphorous diffusion, an ion implantation of argon or carbon, and polysilicon deposition. In addition, the forming of the gettering layer may be done prior to the processing step.

Another aspect of the invention is directed to forming an implanted region at a surface of the at least one substrate opposite the processed surface prior to bonding. The implanting may comprise implanting with a lifetime killing implant. Moreover, the implanting may be in a predetermined pattern to define a plurality of laterally spaced lifetime killing implant regions. The lifetime killing implant may be one of protons, helium atoms, and carbon atoms.

Still another aspect of the invention relates to forming a doped layer at a surface of the at least one substrate opposite the processed surface prior to bonding. The step of forming the doped layer may include implanting a dopant into the surface. The at least one substrate may have a first conductivity type dopant, and the step of implanting may include implanting a dopant of a second conductivity type into the doped layer at a concentration greater than a concentration of the first dopant in the substrate. The doped layer may also be an epitaxial doped layer, such as for a buffer layer for the device. Also relating to an epitaxial layer, a germanium layer may be formed on a silicon substrate.

The bonding may be carried out in a vacuum, and at least one of the substrates to be thinned may be mounted onto a handling substrate prior to thinning. The method may further comprise the step of aligning the substrates prior to bonding. For example, the step of aligning may comprise: defining predefined corresponding portions in each substrate; cutting the substrates along the predefined portions to define cut edges; and aligning the substrates along the cut edges.

To increase device yield the method may further include the step of testing individual devices on each substrate. Accordingly, the aligning of the substrates may be performed to increase a yield of the semiconductor devices.

The step of processing may include forming a metal layer. Thus, the anneal temperature is preferably less than a temperature related to a characteristic of the metal layer. For an aluminum layer, the anneal temperature is preferably less than about 450° C. If a barrier metal is used between the aluminum and substrate, the anneal temperature may be in a range of about 450 to 550° C.

If the metal layers are formed after bonding, the anneal temperature may be higher. For example, when the processing comprises forming at least doped region, the anneal temperature is preferably less than about 800° C. To form a sufficiently strong bond for sawing, the anneal temperature is preferably greater than about 400° C.

For substrates comprising silicon, the method may also include the step of hydrogen terminating silicon surfaces prior to the bonding step. In addition, the surfaces to be bonded may be cleaned of at least one of hydrocarbons and metals.

The processing step preferably comprises forming at least one MOSFET control device, such as to make an IGBT or MCT. In one preferred embodiment, the plurality of substrates is two, and the processing step comprises processing both substrates.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
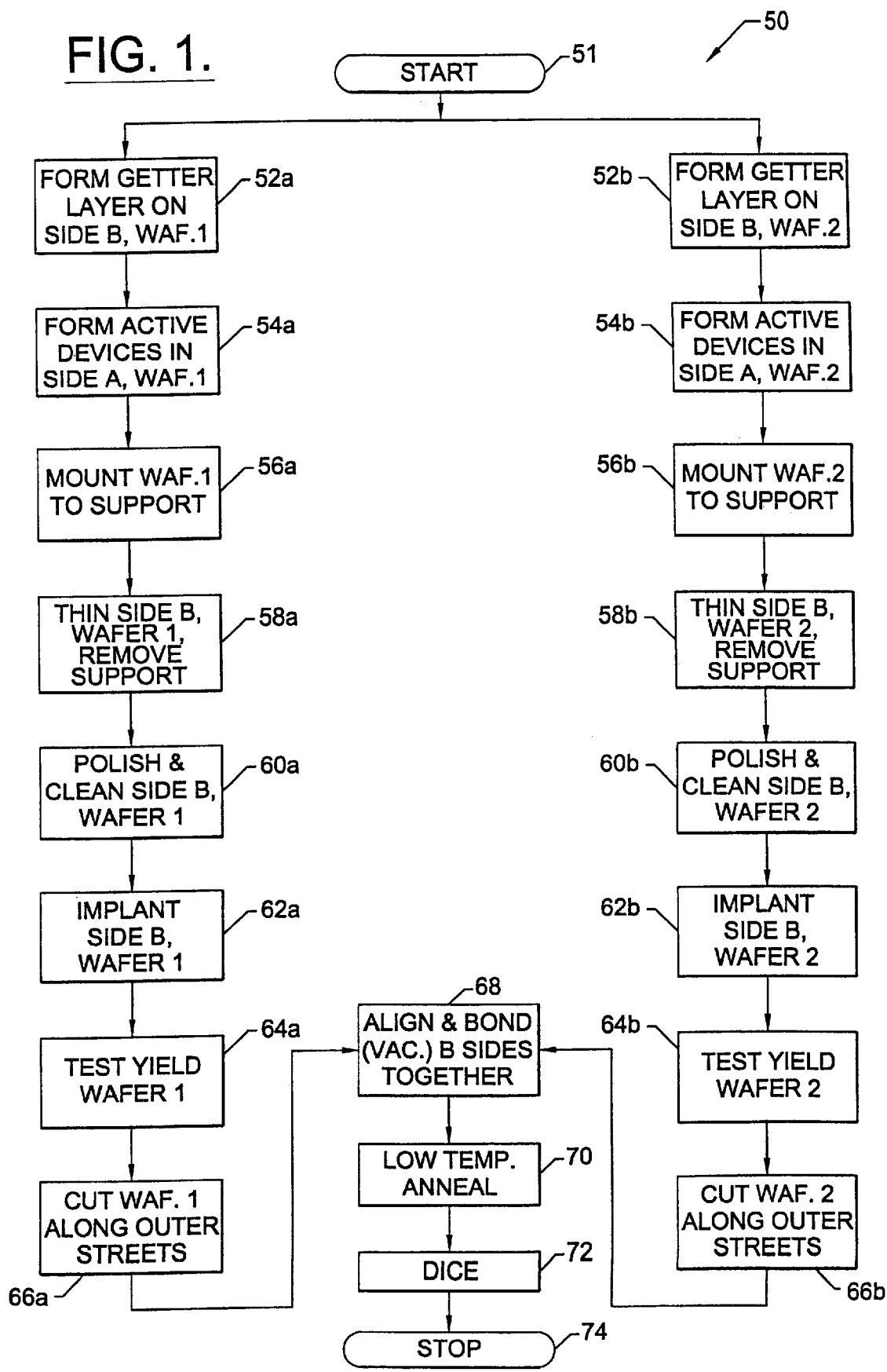
FIG. 1 is a flow chart illustrating a method of semiconductor device fabrication in accordance with the present invention.

Referring initially to the flow chart 50 of FIG. 1, fabrication method aspects of the invention are first described. In this described embodiment, first and second wafers are processed, with the processing blocks for the first wafer being identified in FIG. 1 with the suffix "a", and those to the second wafer designated with "b". Accordingly, only those steps for the first wafer will be described in detail, since those of skill in the art will readily appreciate similar steps may optionally also be performed in this embodiment on the second wafer also.

From the start (Block 51), a gettering layer is formed on the second side, side B, of the first wafer at Block 52a. The gettering layer will be effective in removing contaminants, such as boron, for example, as will be readily appreciated by those skilled in the art. The gettering region will diffuse lifetime killing transition metals from the bulk of the wafer to the gettering site prior to thinning and direct bonding. As would be readily appreciated by those skilled in the art, typical gettering techniques include phosphorous diffusion, ion implantations or argon or carbon, and/or polysilicon deposition on side B of the wafer.

At Block 54a one or more active devices may be formed in a first side, i.e. side A, of the first wafer. The active devices may include one or more doped regions as may be formed by conventional techniques as will be readily appreciated by those skilled in the art. In certain embodiments, metal interconnects may also be formed, as described in greater detail below. The typical processing steps may include one or more of ion implantations, diffusions, metal depositions, polysilicon deposition, silicide formation, oxide growth, etc. The same or different types of MOSFET current controlled devices may be fabricated on the first and second substrates. The devices formed in accordance with the invention are directed to having current conduction in a vertical direction, that is, perpendicular to the interface formed between the bonded together surfaces as will be readily appreciated by those skilled in the art. For single-sided or double-sided devices to work, it is generally required that there be minority carrier flow across the interface for conductivity modulation. If the device has an N− base, then it would be desirable to inject a high density of holes (minority carriers) into the N− base to cause conductivity modulation. The condition for conductivity modulation is that the electron and hole densities in the base are equal. Conductivity modulation causes the electron density to increase much beyond its equilibrium value and thereby lowers the resistance of the N− base significantly as will be readily appreciated by those skilled in the art.

The first wafer may be secured to a handling wafer or support film (Block 56a) and at Block 58a, the first wafer is thinned on side B, thereby removing the gettering layer and the contaminants contained therein. The wafer may be thinned by grinding, for example, to reduce the thickness to less than about 200 nm, although even thinner wafers may be preferred for some applications. The handling wafer or support film may be removed after thinning.

Side B may be polished and cleaned at Block 60a taking care to minimize hydrocarbon voids and to reduce oxygen at the ultimate bonding interface. If metal is exposed on the surface, such as metal bonding pads, it may be advantageous to protect the metal from chemicals used in the cleaning of the wafers. One possible technique is to deposit a protective insulator layer that is resistant to the chemicals. The insulator layer could be removed after the wafers are bonded. The polishing, such as using chemical mechanical polishing (CMP), may be used so that the side B surface has a root-mean-square (RMS) surface roughness less than about 1 nm. A surface roughness of less than about 10 nm is desirable for direct bonding the two substrates together. In addition, if pressure is used in the bonding process, there is a likelihood that poorer surface roughness can be tolerated. The wafers may have a tendency to warp due to the presence of thick dielectric layers, accordingly, pressure may be needed during bonding. Of course, the bonding could also be carried out at elevated temperatures of 200 to 400° C., for example, as will be readily appreciated by those skilled in the art.

The cleaning is to remove hydrocarbons, organics, and metallic impurities from the surface. The cleaning process generally may use chemicals such as those used in RCA clean and piranha cleans as would be readily appreciated by those skilled in the art. Plasmas, UV, ozone, and laser irradiations may also be used to clean the surface prior to bonding.

To remove any native oxide, etching may performed using a dilute hydrofluoric (HF) acid. It may also be desirable to minimize the native oxide regrowth prior to bonding. For silicon, one approach is to hydrogen terminate the silicon surface using a dilute HF etch followed by either no water rinse or minimal water rinse. Another more complicated approach to minimize native oxide is to direct bond the two wafers in either a vacuum, or in an ambient such as purified nitrogen, argon, or hydrogen that minimal concentrations of oxygen. Possible bond anneal ambients include nitrogen, oxygen, argon, hydrogen. One possible mechanism by which the bond strength increases with anneal time is that the hydrogen diffuses laterally along the bond interface and out of the wafer. The ambient may affect how readily the hydrogen diffuses laterally.

As will be readily appreciated by those skilled in the art, the native oxide can impede the current flow across the interface. The hydrophobic approach may be susceptible to hydrocarbon absorption whereas a hydrophilic bonding approach in which there is a thin oxide at the interface may not be susceptible to hydrocarbon absorption.

By hydrogen terminated it will be understood by those skilled in the art that this implies a large percentage of the surface area is also free from oxygen. In other words, the native oxide or oxygen present on the surface is also removed or minimized. In addition, the cleaning may be desired to remove contaminants, such as hydrocarbons and metals from the surfaces to be bonded. The interface may also be considered as devoid of an oxide. It is possible that power switching devices may work even if a very thin oxide layer were present However, the oxide layer would have to be thin enough so that both electrons and holes could tunnel through the oxide. For example, the oxide layer may be desirably less than about 1 nm for satisfactory operation.

At Block 62a side B of the first wafer may then optionally be implanted, such as for lifetime killing and/or with dopants for layers in the power device as will also be described in greater detail below. For example, ion implantation of protons, helium, carbon, argon, oxygen, etc. may be used. Lifetime killing metals, such as platinum or gold may also be implanted or diffused into the surface. The temperature required to diffuse the metals may be generally greater than about 450° C., therefore, it may not be possible to have aluminum on the back surface during the anneal.

To optimize the forward voltage versus turn-off time, it may be desirable in power devices to have localized regions of lifetime killing rather than uniform lifetime killing. In particular, it is often desirable to have localized regions of lifetime killing within the N-type base region near the backside of the P+ emitter anode and/or within the P+ emitter of an IGBT or MCT as will be readily understood by those skilled in the art. There may also be advantages to localizing the lifetime killing implants laterally as well as vertically. In this case, a photolithography step, or metal mesh, may be used to confine higher energy protons laterally within certain regions.

It may also be desirable to have very thin dopant layers located at or near the bonded interface of either or both of the wafers/substrates. Since all of the high temperature processing steps are performed on the wafers prior to thinning, relatively thin dopant layers at or near the bonding interface can be obtained by ion implantation or laser doping, since later high temperature steps are not needed. Such high temperature steps would diffuse the dopants in these thin regions. Laser annealing the implanted dopant may be performed to activate the dopants as will be readily appreciated by those skilled in the art.

As an alternative, a photolithographic step may be used to define the location of the ion implanted dopant. For example, it may be desirable in some cases to define an N+ buffer layer implant for an IGBT or MCT so that there will be little injection of minority carriers into the region near the outside of the chip to obtain fast turn-off.

Since the wafer typically includes a plurality of individual die thereon, these die can be tested (Block 64a) and the results later used to correlate with the second substrate to thereby increase the overall process yield. Yet another aspect of the invention relates to cutting the wafer along the outer streets (Block 66a). This will allow the precise alignment of the first and second wafers at Block 68. The wafers, once properly aligned, may be bonded by bringing same together at a center point and allowing atomic bonding to tend to bring the wafers together extending outwardly from the center. In some embodiments, a relatively high or ultrahigh vacuum may be desirable for the bonding process. The two wafers may also be aligned based upon the crystal orientations of the two wafers as will also be appreciated by those skilled in the art.

At Block 70 a low temperature anneal may be performed. In particular, the temperature may be less than about 800° C. if aluminum is to be added later, but may be 450° C. or less if the aluminum metal interconnects are already provided. If a barrier metal layer is provided between the aluminum and the silicon substrate a higher temperature anneal, e.g., about 450–550° C. may be permitted. Perhaps the best overall gains are achieved if the two wafers are completely processed prior to bonding.

As noted above, a significant requirement of the bond strength is that it be strong enough for a 400° C. anneal to allow sawing or dicing. Accordingly, a bond interface energy of 800 ergs/cm$^2$ is required based on experience. A 400° C. anneal is potentially low enough to slow the formation of a Si—Al eutectic as will be appreciated by those skilled in the art. In other embodiments, laser cutting may be used so that a lower bond strength may be tolerated as will be appreciated by those skilled in the art.

At Block 74, if no further processing is needed, the individual device dies/circuits may be diced from the bonded together wafers using conventional techniques as will be readily appreciated by those skilled in the art. The power switching devices produced in accordance with the present invention have current transport across the bonding interface, that is, perpendicular to the bonding interface.

The method of the present invention allows the fabrication of double-sided MOSFET controlled power switching devices with a significant reduction in the number of sequential process steps by about a factor of two compared to conventional techniques. The direct bonding approaches allows current production recipes for fabricating single-side power devices to be used, and thus a separate process sequence does not need to be developed. The present invention avoids the critical control of thermal budgets as in conventional processing, since an anneal is optimized for one dopant on the top side of the substrate but will not likely be optimized for another on the back side. The conventional approach may also lead to yield losses from scratches, etc. The present invention overcomes these drawbacks and also allows for a gettering operation to remove metal impurities prior to bonding. The yield can also be optimized by mapping the working die in the two wafers and aligning the wafers for best yield.

The direct bonding after processing of the invention can be used to implement high performance IGBTs, MOSFETs, and MCTs, for example. The directed bonded devices may also have an ultra-thin N+ buffer layer which will provide significant improvements in the turn-off time compared to alternate approaches as described in greater detail below. In addition, the direct bonded IGBTs and MCTs will have a novel feature of positive temperature coefficient for forward voltage which arises from a negative temperature coefficient for current gain.

It may also be advantageous to bond a silicon MOSFET current control power device in a first substrate to a second substrate that includes SiC material. Other candidates for the material of the second substrate may include GaN, InP, and GaAs. Wide bandgap materials, such as SiC, generally have a high critical field of electrical breakdown, and also have high saturated drift velocities. Thus, wide bandgap materials are often desirable to be used to support most of the high voltage drop across depletion layers in power devices. Another reason for selecting a material for the second substrate to be different than silicon is to provide a high thermal conductivity. Thus, SiC, which has a three times higher thermal conductivity than silicon may be used for the second substrate. Of course, in other embodiments, two or more non-silicon substrates may be processed and bonded in accordance with the present invention.

Turning now to FIGS. 2–5, one aspect of the present invention is directed to an approach to achieve a double-sided MOSFET controlled power switching device using low temperature direct semiconductor—semiconductor wafer bonding by fabricating two MOSFET current control devices on two separate wafers, thinning the wafers from the backside to approximately 200 μm, and then performing aligned bonding of the wafers. Perhaps the greatest advantage of this approach occurs when the two wafers are almost completely processed prior to bonding. In this case aluminum interconnects are present on the surface and the maximum allowed bonding anneal temperature is about 450° C. If a barrier metal is used between the aluminum and silicon junction, bond anneal temperature of about 450–550° C. may be used. Higher temperature bonding anneals are permitted if the metal interconnects are not present. Of this case, the MOSFET current control wafers would be fabricated through the contact window photostep. One main requirement is that the bonding anneal not cause excessive diffusion of source/drain implants, and, thus, bond anneal temperatures in the 800–900° C. range are allowed.

Figure 2:
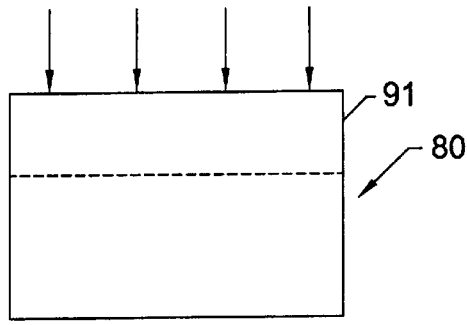
FIGS. 2–5 are cross-sectional views of one substrate being processed in accordance with the present invention.
Figure 5:
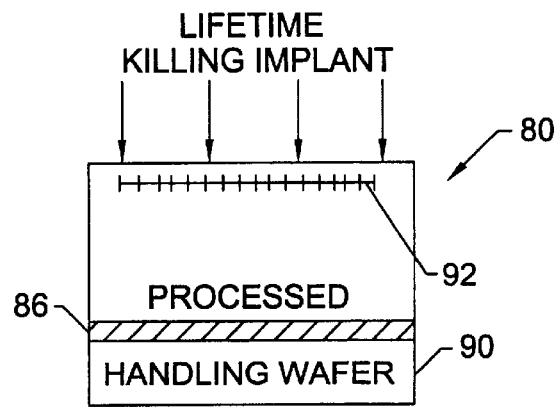
Figure 3:
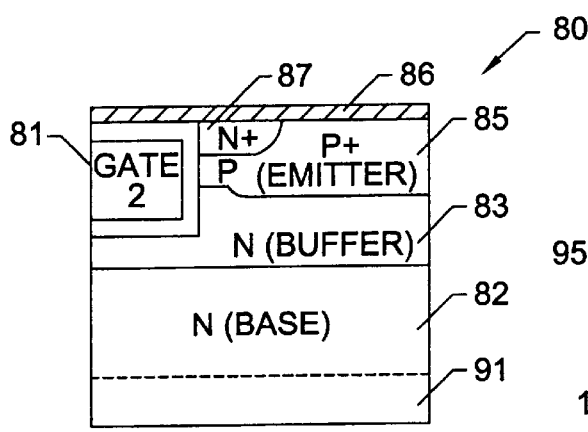

Initial processing of a first substrate 80 is shown in FIG. 2. The first substrate 80 will be direct bonded to a second substrate 95 to produce a double-sided MCT 110 (FIG. 6) as will be appreciated by those skilled in the art. A gettering implant 91 is provided as described in detail above. Next, as shown in FIG. 3, various dopant regions are formed in the upper surface of the substrate 80, along with the illustrated second gate region 81. The illustrated processed portion further includes an N-type base 82, an N-type buffer layer 83 on the N-type base, and a P+ emitter 85 on the P-type base. The substrate 80 also includes an anode layer 86 and an N+ region 87.

Figure 6:
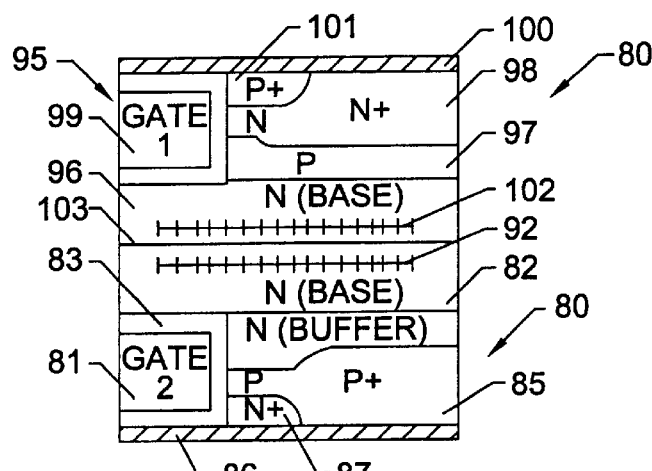
FIG. 6 is a cross-sectional view of an IGBT in accordance with the present invention and produced using the steps illustrated in FIGS. 2–5.
Figure 4:
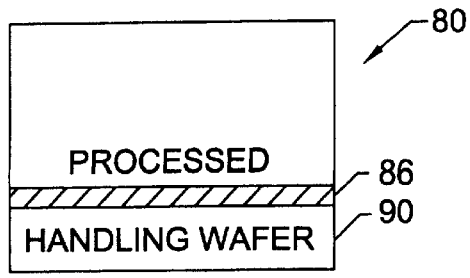

The first substrate 80 is joined to the handling substrate 90 or wafer, and the gettering layer 91 is removed by thinning to produce the intermediate structure shown in FIG. 4. A lifetime killing implant 92 is schematically illustrated being formed in the first substrate 80 in FIG. 5. In FIG. 6, the thus processed first substrate 80 is joined to a second substrate 95 after cleaning, direct bonding, and the low temperature anneal. The second substrate 95 illustratively includes an N-type base 96, a P-type base 97 on the N-type base, an N+ emitter 98 on the N-type base, a first gate 99, a cathode layer 100, and the illustrated P+ region 101. The second substrate 95 also illustratively includes the lifetime killing implants 102. An interface 103 is schematically illustrated between the first and second substrates 80, 95.

Special considerations arise for implementing double-sided switching power devices using low temperature direct bonding. The first requirement is the need for near ideal current conduction across the bonding interface. This requires that there be minimal native oxide at the bonding interface. Prior researchers have demonstrated that by using hydrophobic bonding in which the silicon surfaces are hydrogen terminated, bonding interfaces with minimal native oxide can be obtained. Also special considerations should be given to reducing boron and heavy metal contamination during the surface cleaning operations. Another requirement is that bubbles and microvoids must be minimized at the bonding interface.

Low temperature hydrophobically bonded wafers seem to be particularly susceptible to hydrocarbon generated voids, and thus special attention should also be paid to cleaning procedures that remove hydrocarbons. Yet another requirement is low minority carrier recombination at the bonding interface. A possible advantage for low temperature direct bonding, as compared to conventional high temperature anneals (>1100° C.) bonding, it that the low temperature bonded interface may have less defects due to lattice misorientation of the two wafers since there is less driving energy for defect formation.

Figure 7:
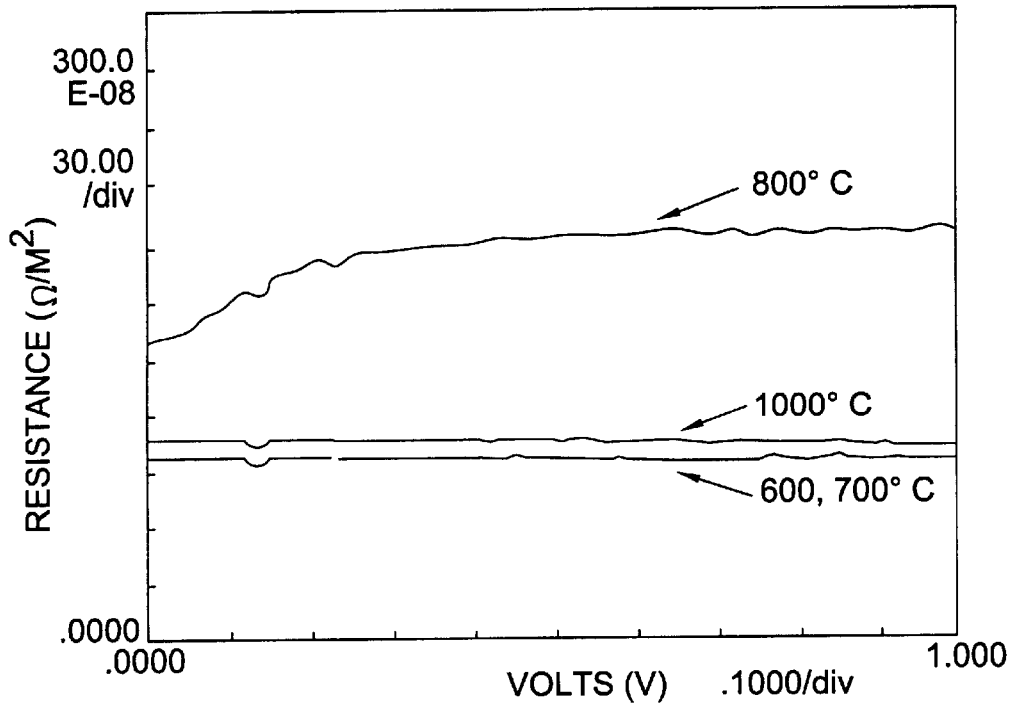
FIG. 7 is a graph of resistance characteristics for an N—N hydrophobically bonded wafers as a function of anneal temperature.

Turning now to FIGS. 7 through 12, results from bonding experiments show that N-type to N-type and P-type to P-type silicon <100> wafers can be hydrophobically bonded using low temperature anneals without producing potential barriers in either the conduction or valence bands. The cleaning procedure that was used to achieve a hydrogen terminated surface included combination of $O_2$ plasma and piranha cleans followed by a 10:1 HF dip, without a water rinse following the HF dip. Electrical data for the N-type to N-type wafers for various anneal temperatures is shown in FIG. 7.

The presence of potential barriers shows up in the resistance characteristics as a nonlinearity in the resistance for low biases. There is no evidence of a potential barrier for the 600° C. and 700° C. anneals. However, the resistance increased for 800° C. anneal and is nonlinear, indicating the formation of a barrier. For a 1000° C. anneal, the resistance decreases and does not have nonlinearities. Without wishing to be bound thereto, it is theorized that the potential barrier that is observed for the 800° C. anneal is most likely caused by the activation of boron, present on the wafer surface prior to bonding due to boron absorbed from the atmosphere. For the 1000° C. anneal, boron diffuses away from the interface resulting in reduction in the potential barrier height.

Figure 8:
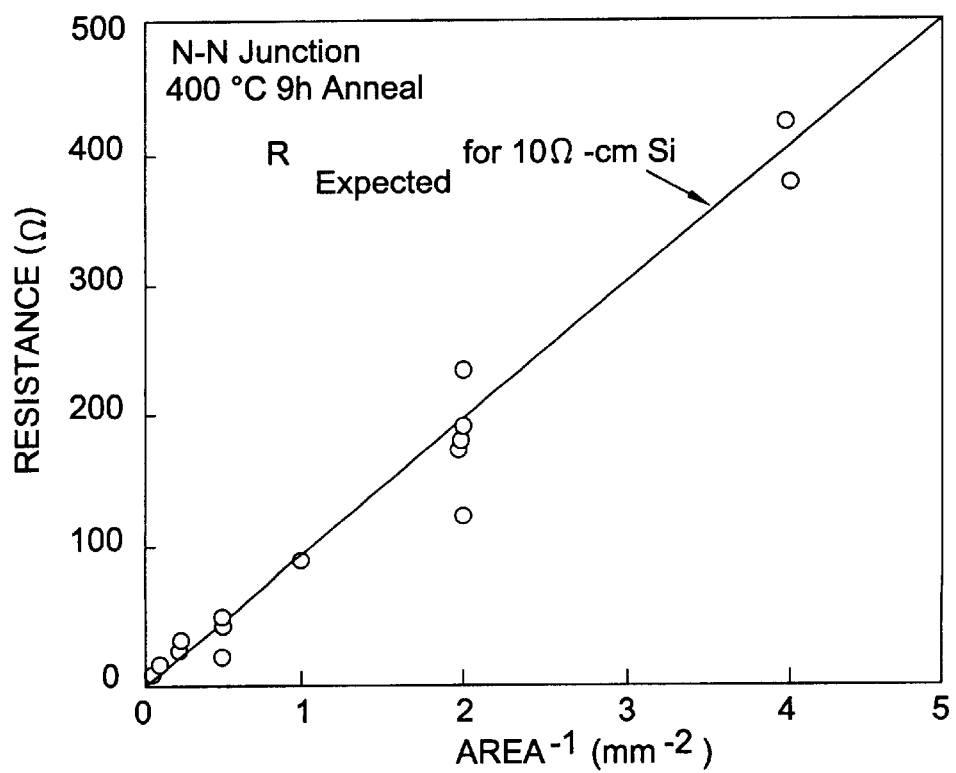
FIG. 8 is a graph of resistance versus inverse die area for N—N hydrophobically bonded wafers annealed at 400° C., and wherein the solid line represents expected resistance.
Figure 9:
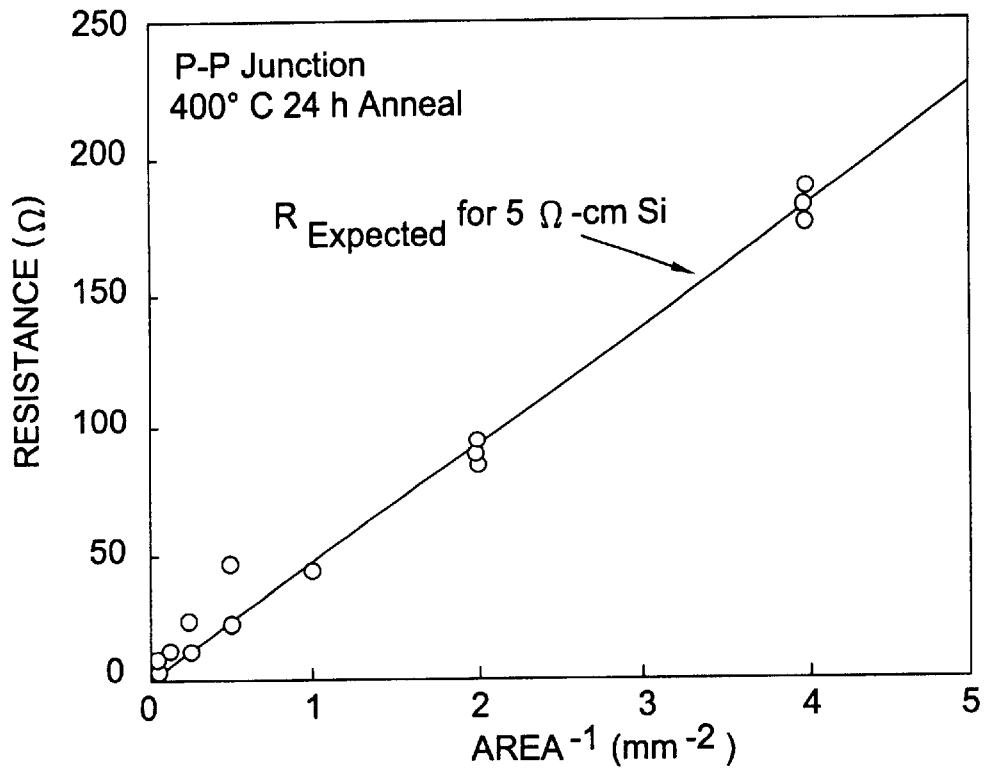
FIG. 9 is a graph of resistance versus inverse die area of P—P hydrophobically bonded wafers annealed at 400° C., and wherein the solid line represents expected resistance.

Also, the dependence of resistance as a function of area and variation of resistance for a given area were examined to evaluate the quality of the bonded interface. FIG. 8 shows the resistance versus inverse area and a scatter plot of resistance values for N-type to N-type wafers annealed at 400° C. for 9 hours. FIG. 9 shows a similar result for a P-type to P-type bond annealed at 400° C. for 24 hours.

Figure 10:
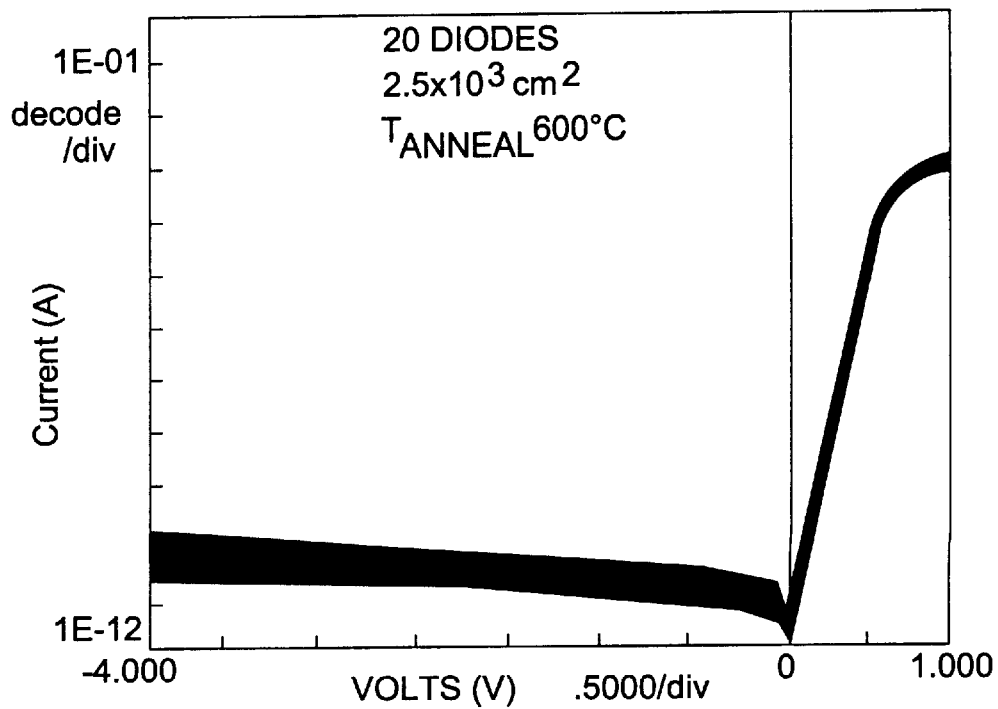
FIG. 10 is a graph of forward and reverse current-voltage characteristics for twenty diodes fabricated from hydrophobically bonding P-type and N-type silicon wafers.
Figure 11:
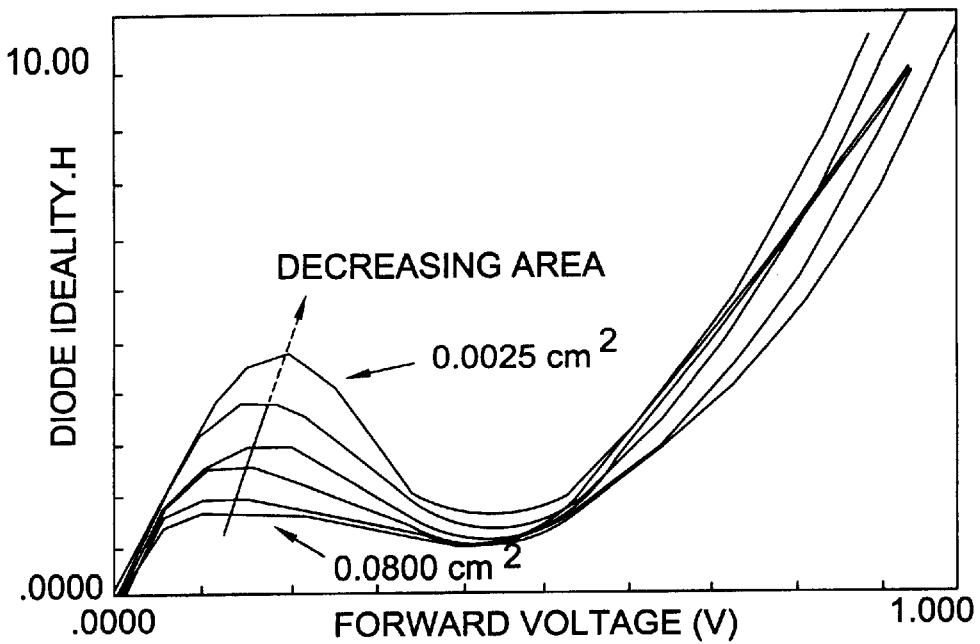
FIG. 11 is a graph of diode ideality characteristics versus forward bias as a function of diode area for hydrophobically bonded P—N junctions.

The electrical characteristics of PN junctions prepared by low-temperature hydrophobic bonding were also examined. FIG. 10 shows forward and reverse current-voltage characteristics for twenty diodes fabricated from hydrophobically bonded P-type to N-type wafers for a 600° C. bond anneal. The leakage current density is approximately 40 $nA/cm^2$ despite the fact that the edges of the PN junction mesas were unpassivated, and which may be the lowest leakage current density obtained for hydrophobically bonded wafers. FIG. 11 shows the calculated ideality factor for small forward biases for PN diodes with varying areas. The measurements show a strong dependence on area, with the smallest area diodes having the largest ideality factor values. Increases in ideality factor values above 1.0 are typically due to minority carrier recombination, either at the metallurgical junction or the perimeter of the device. The measured dependence on area shows that the high ideality factor is due to recombination that is occurring at the edges of the unpassivated, sawed mesas. The ideality factor approaches a value of 1.0 as the area of the diode increases. These are the best ideality factors for low temperature bonded devices.

Figure 12:
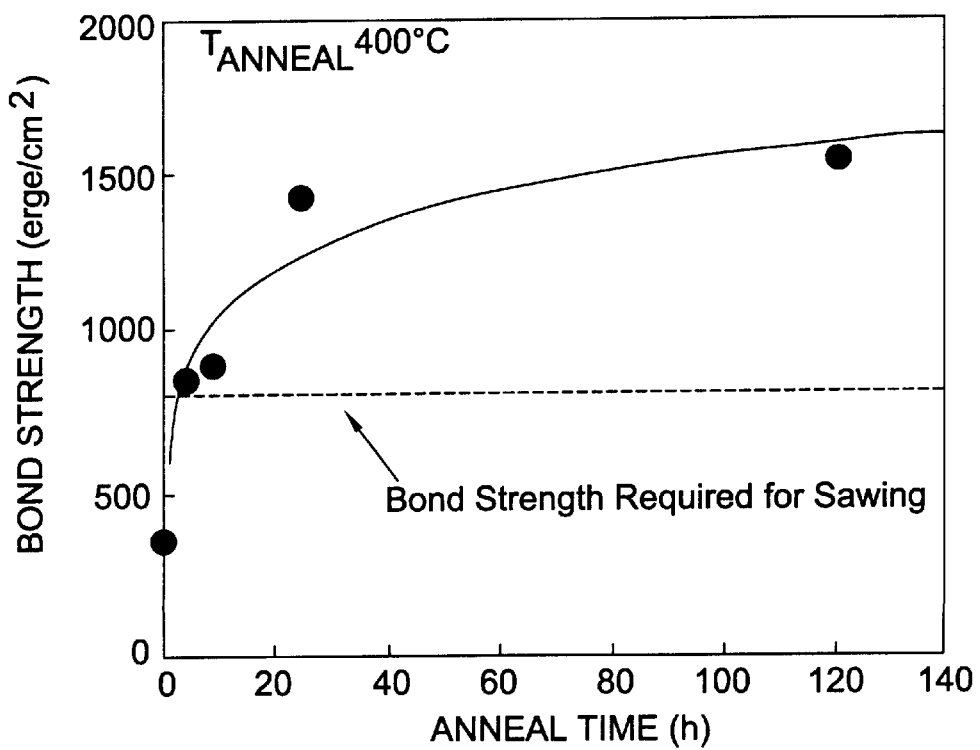
FIG. 12 is a graph of bond strength as a function of anneal time for hydrophobically bonded wafers annealed at 400° C., and wherein the dashed line indicates 800 ergs/cm² as is needed for sawing and processing, and wherein the solid line is a least-squares fit to A+Blog(x).

A significant requirement, in addition to the electrical characteristics, is that the bond strength be strong enough for a 400° C. anneal to allow sawing or dicing of the switching power devices. From experience, a bond interface energy of greater than 800 $ergs/cm^2$ is required to provide sufficient bond strength. FIG. 12 shows that the bond strength increases logarithmically with anneal time, indicating a first order reaction for the bond kinetics at 400° C. A 400° C. anneal was chose because it is potentially low enough to slow the formation of Si—Al eutectic.

The experimental measurements show that low temperature direct wafer bonding is a suitable approach for fabricating double-gate MOSFET controlled switching power devices. Near ideal electrical conduction across the bonding interface can be obtained for bond anneal temperatures in the range of 400–700° C. A hydrophobic cleansing process has been developed that minimizes hydrocarbon generated voids and has very little oxygen at the bonding interface. A bond interface energy of 1000 $ergs/cm^2$ was obtained for a 9 hour 400° C. anneal which is sufficient to allow sawing of wafers.

Figure 13:
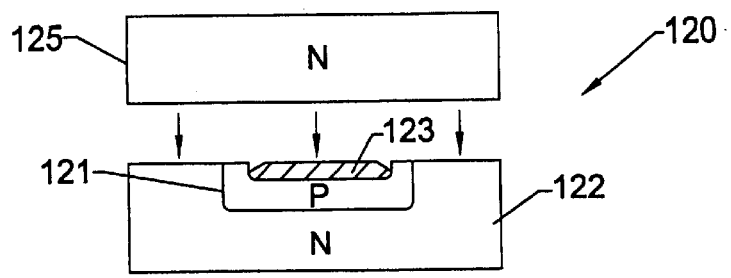
FIG. 13 is a cross-sectional view of a bonding P—N junction area between two substrates in accordance with the present invention.

Referring now additionally to FIG. 13, another aspect of the invention is described. Because low bonding anneal temperatures are used in accordance with the present invention, it is possible to have defined metal or silicide lines formed on either or both of the substrates prior to bonding to provide low resistance for a PN junction at the interface, if desired. A possible process to implement a low resistance metal or silicide strapped PN junction is to use a photolithography step to define an implant of P-type dopant 121 into the N-type substrate 122 of the intermediate structure 120 shown in FIG. 13. A second photostep is used to define the location of the metal or silicide strip 123 within the P-type dopant region 121. The resist mask can be used to etch about 100 nm of silicon. About 30 nm of tungsten can be evaporated. The excess tungsten that is on the surface of the resist can be removed by lift-off, followed by an anneal to form tungsten silicide 123. As will be readily appreciated by those skilled in the art, an alternate approach may be to use a polishing technique to polish silicide that is formed above the silicon surface back planar with the adjacent silicon surface. The silicide can also be used to lower the resistance of a blanket doping layer, such as lowering the P-type base resistance of a Gate Turn-off Thyristor.

Figure 14:
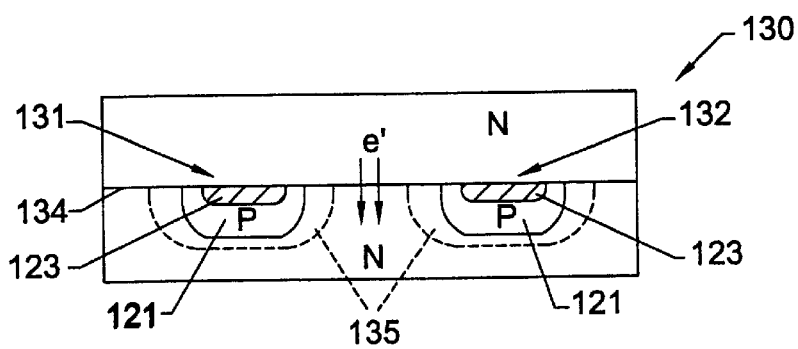
FIG. 14 is a cross-sectional view of a pair of P—N junctions at the direct bond interface that may be used to form a vertical JFET that can switch the conduction of current across the bond interface.

Turning now additionally to FIG. 14, a grid of low resistance PN junctions can be used as gates of a vertical JFET 130. The pair of illustrated junctions 131, 132 may be used to modulate a current flow perpendicular to the junctions, that is, across the interface 134. Of course, a plurality of such junctions could also be formed. The depletion regions 135 are formed around the P doped regions 123 as will be appreciated by those skilled in the art. In yet another variation of the invention, MOS gates could be formed on the sides of trenches and operate in the depletion mode in which the current is being conducted between the channels at zero source-to-gate bias, and the gate is biased to increase the depletion layer to turn off the device. A grid of silicide lines at the interface between the two substrates 125, 122 can be used to form a permeable base transistor in which reverse biased Schottky diodes are used to modulate the current flow perpendicular to the grid of silicide lines 123 as will be readily appreciated by those skilled in the art.

For the above described PN junction, low resistance P-type base layer, and Schottky diode, it may be necessary to provide a contact to the silicide from the top surface of either of the substrates. Vias may be chemically or plasma etched from the top surface of either substrate to the silicide or metal layer using the silicide or metal layer as an etch stop layer. Another suitable technique may be to laser drill a via through the upper substrate 125 (FIG. 13), and stop at the metal or silicide layer.

Yet another aspect of the invention is the ability to epitaxially grow semiconductor layers on either or both of the substrates prior to bonding. If aluminum interconnects are on the substrates, the epitaxial growth should be at a temperature of less than 450° C., and less than 450 to 550° C. if a barrier metal layer is used as described above.

Figures 15, 16:
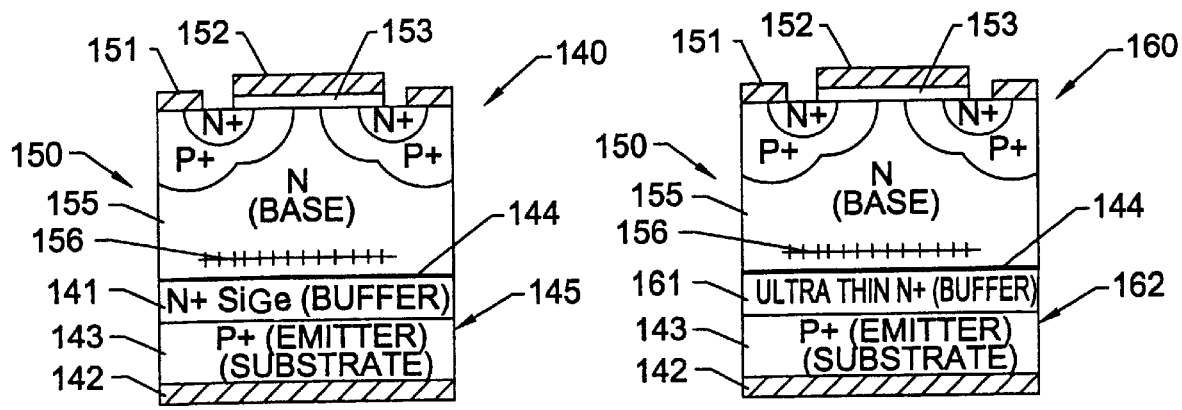
FIG. 15 is a cross-sectional view of a direct bonded IGBT including a thin N+ SiGe layer in accordance with the present invention.
FIG. 16 is a cross-sectional view of a direct bonded IGBT including an ultra-thin ion implanted or epitaxially grown N+ buffer layer in accordance with the present invention.

For example, as illustrated in FIG. 15 it is possible to grow an ultra-thin N+ buffer layer to define a SiGe heterojunction layer 141 on the silicon surface of a substrate 145 prior to bonding to the second substrate 150. The completed IGBT 140 also includes an anode layer 142, a P+ substrate emitter layer 143 adjacent the anode, and the SiGe buffer layer 141 adjacent the interface 144. The upper substrate 150 includes an external emitter layer 151, a gate layer 152 and its underlying insulator layer 153. The upper substrate 150 also includes the N-type base 155 including the lifetime killing implant 156 as discussed above. The other doped regions of the upper substrate 150 will be readily understood by those skilled in the art without further description. The SiGe base-emitter heterojunction that is properly configured may also have negative temperature coefficient for current gain, and, thus, positive temperature coefficient for forward voltage. This characteristic will provide short circuit protection and help prevent thermal run away as will be readily appreciated by those skilled in the art.

It is also possible to grow ultra-thin high concentration dopant layers on the surface of a substrate prior to bonding. For example, as shown in the IGBT 160 of FIG. 16 an ultra-thin N+ buffer layer 161 may be grown on the lower substrate 162. The other portions of the IGBT 160 of FIG. 16 are similar to those of FIG. 15 and indicated by the same reference numerals so that no further description is needed to those skilled in the art. The N+ buffer layer may be fabricated by implanting a thin, about 200 nm thick, layer with a concentration of about $1 \times 10^{19}$ cm$^{-3}$ of N-type dopant, such as arsenic, antimony or phosphorous into the surface of the P+ substrate. The P+ substrate may have a concentration of about $3 \times 10^{18}$ to $1 \times 10^{19}$ cm$^{-3}$ of P-type dopant. The substrate can then be annealed at a temperature of from about 900 to 1000° C. to anneal the defects created during ion implantation as would be readily appreciated by those skilled in the art.

The thinner the N+ buffer layer 161, the faster the turn-off time. Typically just before turn-off, the majority of the stored base charge is either near or in the N+ buffer layer 161. Accordingly, the thinner the N+ buffer layer 161, the closer the stored base charge is to the P+ emitter 143 and the less distance the stored base charge has to diffuse to reach the P+ emitter and recombine as will also be readily appreciated by those skilled in the art.

It may sometimes be desirable to prevent injection of minority charge carriers into the region outside of the active area. A techniques to prevent the injection is to reduce the injection efficiency of holes in this region. Thus, a photolithography step can be performed to define a thick N+ ion implant into the regions outside of the active area to thereby reduce the injection efficiency. Other techniques could also be used, such as to have a defined oxide barrier at the bonding interface 144.

The thin epitaxial layers of SiGe or high N-type concentration dopant can provide key advantages for the high performance IGBTs or MCTs. For example, thin, high concentration dopant layers can be used for the N+ buffer of an IGBT to achieve short turn-off time and negative temperature coefficient for current gain. Of course, if the substrate was used as an N+ emitter, then the device would be processed to have a P+ ultra-thin buffer layer as will be readily appreciated by those skilled in the art.

Because of the semiconductor device physics of bandgap narrowing in highly doped semiconductors, it can demonstrated that if doping concentration of the N+ buffer layer 161 is greater than the doping concentration of the P+ emitter 143, then a negative temperature coefficient for the current gain for the backside emitter of the IGBT 160 or an MCT can be obtained. The equations for this principle are given below.

Electron Injection Efficiency $$(EIE) = J_e/J_h,$$

and $$J_e = (qR_{ip}^2 D_p/N_A W_P)e^{qv/kT};$$

$$J_h = qR_{in}^2 D_n/N_D W_e$$

For a short base assumption, w>>L, then $$EIE = \frac{qR_{ip}^2 D_p / N_A W_P e^{qv/kT}}{qR_{in}^2 D_N / N_D W_e e^{qv/kT}} = \frac{R_{ip}^2}{R_{in}^2} \cdot \frac{Q_N}{Q_P}$$

-continued $$R^2_{i_{eff}} = N_y N_c e^{Eg/kT}$$

$$EIE = \frac{Q_N}{Q_P} \cdot \frac{N_v N_c}{N_v N_c} \cdot \frac{e^{Eg_P/kT}}{e^{Eg_N/kT}} = \frac{Ri_P^2}{Ri_n^2} \cdot \frac{Q_N}{Q_P} e^{(Eg_P Eg_N)/kT}$$

For Case 1 $Eg_N > Eg_P \rightarrow +\delta Eg$ $$EIE = \frac{Q_N}{Q_P} e^{\delta Eg/kT} \quad \delta Eg = Eg_P - Eg_N$$

Therefore, as the temperature increases, the EIE decreases.
For Case 2 $Eg_p < Eg_n$ $$EIE = \frac{Q_N}{Q_P} e^{-\delta Eg/kT} = \frac{Q_N}{Q_P} \cdot \frac{1}{e^{+\delta E/kT}}$$

Therefore, as the temperature increases, the EIE decreases.

Figure 17:
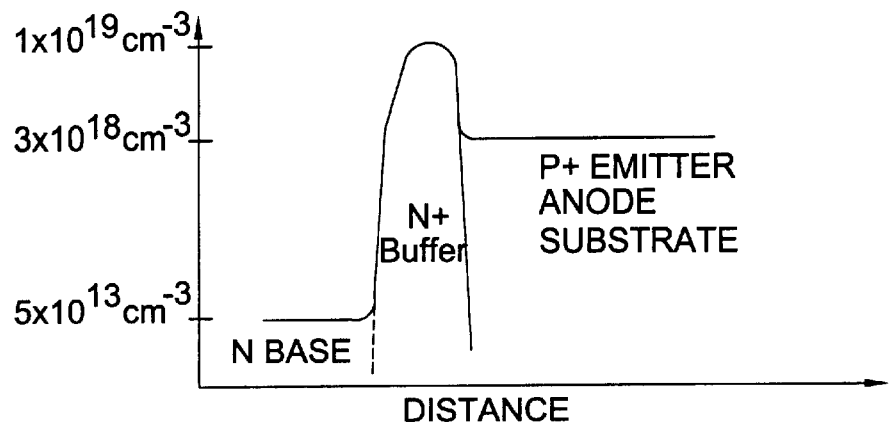
FIG. 17 is a graph of doping concentrations versus distance near the N+ buffer layer and P-type emitter anode of an IGBT or MCT in accordance with the present invention.

The device physics for a P+ emitter with an N+ base buffer layer that is higher in concentration than the P+ emitter results in a negative temperature coefficient for current gain. The profiles are illustrated in FIG. 17 for the various portions of the device near the interface. The interface could be on either side of the N+ buffer as will be appreciated by those skilled in the art. The negative temperature coefficient for current gain implies that the current in an IGBT or MCT decreases as the temperature increases. The current decreasing at higher temperatures means that the forward voltage will increase. Thus, the IGBT and MCT will have a positive temperature coefficient for forward voltage. A positive temperature coefficient for forward voltage for both IGBTs and MCTs is important to prevent thermal runaway and providing short circuit protection.

In designing the N+ buffer layer, it is important to have an N+ buffer concentration that is higher than the P+ emitter; however, the N+ buffer must also be thin enough to provide sufficient current gain for the IGBT and MCT P+ backside emitters.

The approach of using direct bonding or previously fabricated substrates that contain MOSFET current control devices has a particular advantage for making an IGBT or MCT with the N+ buffer concentration higher than the P+ substrate, and being relatively thin to produce acceptable current gain for the backside P+ emitter. A common approach used to presently make IGBTs or MCTs is to grow the N+ buffer using high temperature epitaxial growth. The high temperature epitaxial growth will diffuse the N+ dopant to make a thick buffer layer (10 to 20 $\mu$m thick). Because there is a maximum allowed N+ buffer integrated doping concentration, it is generally necessary that the N+ concentration be lower than the P+ substrate concentration to obtain backside P+ emitter current gain. Also, high temperature (1100 to 1200° C.) anneals are typically used to diffuse P-type dopant to produce deep P-type junctions for field termination. If this high temperature process step is used after the N+ buffer is formed, this anneal will also diffuse the N-type dopant increasing the N+ buffer width. Since the integrated N+ buffer dopant (concentration integrated over thickness) must be low enough to provide sufficient gain for proper IGBT and MCT operation, a thicker N+ buffer must have a lower concentration. The high temperature field termination anneal thus makes it difficult to have an N+ buffer with a concentration greater than the P+ emitter concentration.

A preferred approach to achieve an N+ buffer with a dopant concentration higher than the dopant concentration in the P+ emitter is to ion implant N-type ions (arsenic, phosphorous, antimony) into a P+ substrate that has a concentration of approximately $3 \times 10^{18}$ cm$^{-3}$. Because the ion implanted N-type dopant concentration is greater than the P+ doping concentration, the N-type dopant will over compensate the P+ doping concentration, and a thin, N+ layer can be formed on the pre-bonded surface of the substrate. The N+ buffer implant can also be made into the prebonded surface of the other substrate. Since one of the substrates will have a thickness between 100 $\mu$m and 200 $\mu$m and may have metal interconnects on the surface thereof, it may generally be more difficult to perform the ion implant anneal.

An alternate approach to make a thin N+ buffer with a concentration higher than the P+ emitter is to epitaxially grow the N+ buffer on the prebonded surface of either substrate before bonding.

Figure 18:
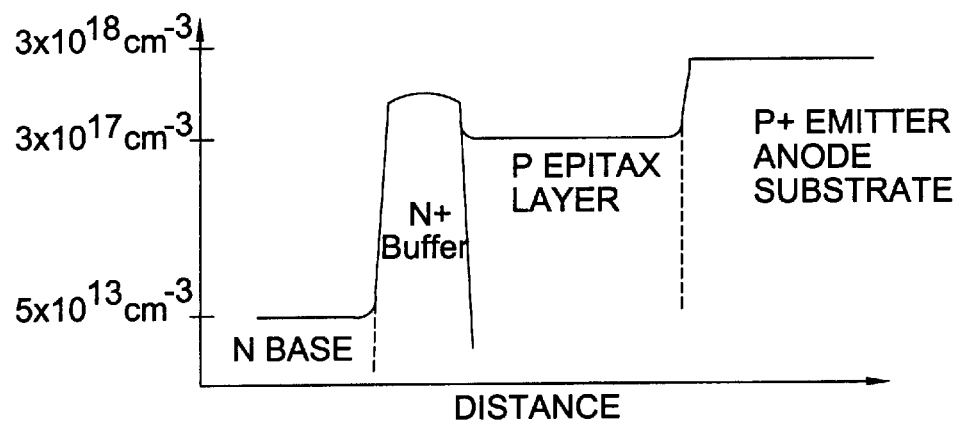
FIG. 18 is a graph of doping concentrations versus distance near the N+ buffer layer and P-type emitter anode that further includes a P-type epitaxial layer grown on the P substrate in accordance with the present invention.

If the P+ substrate concentration is too high (such that a P+ to N+ junction would have too low of a breakdown voltage, have too much leakage current, or be too high concentration so that it is difficult to have an N+ buffer concentration greater than the P+ concentration) then an alternate approach is to first grow a lower concentration P-type epitaxial layer on the P+ substrate as understood with reference to FIG. 18. It is likely necessary to optimize the thickness and concentration of the P-type epitaxial layer. If the P-type epitaxial layer is thick enough (must be thicker than the diffusion length of electrons into the P+ emitter), then the doping concentration of the P-type epitaxial layer will determine the effective emitter concentration that determines the injection efficiency. For this case, the P-type epitaxial layer may be tens of microns thick and have a doping concentration of approximately $1 \times 10^{17}$ cm$^{-3}$. An approach for a thinner P-type epitaxial layer is to perform process steps to reduce the minority carrier lifetime in the P-type epitaxial layer. The diffusion length for electrons into the P-type emitter is determined by the recombination time for electrons in the P-type emitter. For this case of low P-type emitter concentrations, relatively low N+ buffer concentrations are required to meet the criterion that the N+ buffer concentration be greater than the P+ emitter concentration. An N+ buffer ion implant can now be made into the epitaxially grown P-type layer, or an N+ epitaxial layer grown on the P-type epitaxial layer growth. Direct bonding of the two substrates can now be performed.

As described above, an alternate way to achieve negative temperature coefficient for current gain is to epitaxially grow a SiGe strained N+ buffer layer on the prebond surface of either substrate. Thin epitaxial layers of SiGe or high N-type concentration dopant can provide key advantages for high performance IGBTs and MCTs. For example, thin, high concentration dopant layers can be used for the N+ buffer of an IGBT to achieve short turn-of time and negative temperature coefficient for current gain.

In particular, thin layers of SiGe can act as the N+ buffer layer for an IGBT or MCT. Since the N+ buffer layer will be thin, the IGBT will have fast turn-off time. A SiGe base-emitter heterojunction that is properly designed also has negative temperature coefficient for current gain and thus positive temperature coefficient for forward voltage. This characteristic will provide short circuit protection and help prevent thermal run away. If a first substrate is used as an N+ emitter, then the device would be processed to have a P+ buffer made into the second substrate.

There are some non-bonding approaches for achieving an N+ buffer concentration higher than the P+ emitter concentration to obtain a positive temperature coefficient for an IGBT and/or MCT. A first approach is an ultra-thinning approach, wherein the key requirement to achieve an N+ buffer concentration higher than P+ emitter concentration is to minimize temperature steps after the N+ buffer formation. A preferred fabrication approach is to:

1. Perform the processing steps needed to form the necessary MOSFET current control devices to implement an IGBT or MCT on the front side of a semiconductor substrate. A preferred approach is to complete all process steps including all of the metal interconnects, dielectric depositions, and photolithography steps before thinning.

2. Thin the substrate from the backside to approximately 100 μm.

3. Form a P+ emitter into the backside of the thinned substrate by implanting a high dose of boron ion with a peak implant depth of approximately 100 nm.

4. Form a high concentration N+ buffer layer into the substrate back surface by implanting phosphorous ions to a depth of approximately 500 nm.

5. Anneal to activate boron and phosphorous ion implant dopants. If there is metal on the front surface, the maximum anneal temperature is approximately 450 to 550° C. using conventional furnace annealing procedures. The 450 to 550° C. will only partially activate the boron and phosphorous implant dopants.

A technique to achieve almost complete activation of the implanted boron and phosphorous ions even with metal interconnects present on the front surface is to use repetitive short pulses of excimer laser illumination. An alternate technique to implement an N+ buffer with a higher concentration than the P+ emitter on the back surface of the thinned substrate is to epitaxially grow the N+ buffer and P+ emitter on the back surface at approximately 500° C. If there are barrier metals under the aluminum interconnect, then growth temperatures of 500° C. are allowed. Molecular Beam Epitaxially (MBE) growth techniques include Metal Organic Chemical Vapor Deposition (MOCVD) and Ultra-high Vacuum Chemical Vapor Deposition (UHVCVD). It is also possible to deposit N+ and P+ amorphous silicon layers and then regrow the layer's single crystal layer at approximately 500° C. using solid phase epitaxial regrowth. An alternate technique to form a P+ emitter on the back surface is to use a P+ polysilicon layer. This type of emitter sometimes has a thin native oxide between the polysilicon layer and the single crystal layer that can provide an increase in current gain and in some cases, less change in current gain with temperature.

High anneal temperatures can be used to activate the ion implanted dopants on the back surface if metal interconnects are not present on the front surface in step 1 (in this case, the substrate is processed to just before metal deposition). In this case, the substrate is thinned, boron and phosphorous are implanted into the back surface, and an anneal at 800 to 900° C. is used to activate the implanted dopants. It will be necessary to perform the process steps and photolithography steps on the front surface to complete the process to make an IGBT. The difficult aspects of this process are that the wafer is approximately 100 μm thick at this point. It will generally be necessary to temporarily attach the wafer to a support wafer during the remaining process steps and then to remove the support wafer at the end of the process steps or just before the metal sinter step. Alternately, the thinned IGBT or MCT substrate could be permanently bonded or soldered to a metal substrate, and the remaining processing steps completed.

A technique for making a relatively narrow N+ buffer layer is to implant an N+ buffer into the prebond surface of a low N-type dopant concentration substrate, anneal the implant dopant, and then direct bond the substrate to a P+ emitter substrate. It is also possible to implant the N+ buffer dopant into the P+ substrate and over compensate the P+ dopant concentration. The N-type substrate is then thinned to approximately 100 μm and the diffusion and process steps to make an IGBT or MCT are next performed. The highest temperature step is a 1100 to 1200° C. anneal to diffuse boron to make a deep junction for field termination. This high temperature step will cause the N+ buffer to diffuse and thus increase the thickness of the N+ buffer. With proper design and anneal temperature steps, it may be possible to produce an IGBT or MOSFET with the N+ buffer concentration higher than the P+ emitter concentration.

One approach to achieve an N+ buffer concentration higher than the P+ emitter concentration is to grow a relatively thick (10 μm) P-type epitaxial layer with a dopant concentration of approximately $1 \times 10^{17}$ cm$^{-3}$ on the P+ substrate as illustrated in FIG. 18. The low concentration N-type substrate with the N+ buffer implanted into the prebond surface is then direct bonded to the P-type epitaxial surface. The effective dopant concentration for the P-type emitter injection efficiency will be the P-type epitaxial layer dopant concentration rather than the P+ substrate dopant concentration.

Yet another approach to achieve an N+ buffer concentration higher than the P+ emitter concentration is to grow a relatively thick (10 μm–20 μm) P-type epitaxial layer with a dopant concentration of approximately $1 \times 10^{17}$ cm$^{-3}$ on the P+ substrate as shown in FIG. 18. This epitaxial growth is followed by the epitaxial growth of an N+ buffer, and finally the epitaxial growth of the N− base layer. Since the epitaxial growth is a very high temperature process, it is difficult to achieve a thin N+ buffer and thus, it is difficult to achieve the condition that the N+ buffer concentration is greater than the P+ emitter concentration. The effective dopant concentration for the P-type emitter injection efficiency will be the P-type epitaxial layer dopant concentration rather than the P+ substrate dopant concentration.

Figure 19:
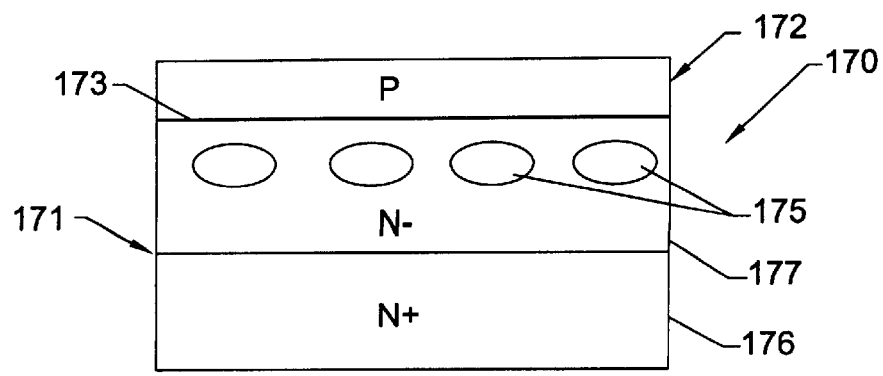
FIG. 19 is a schematic cross-sectional view of the bond interface area and further illustrating localized recombination areas in accordance with the present invention.

Another aspect of the invention relates to lateral localized lifetime killing near the direct bonded interface of IGBTs and MCTs. There can also be advantages to localizing the lifetime killing implants 175 laterally as well as vertically as shown schematically in the device 170 of FIG. 19. The device 170 also is formed from an upper substrate 172 bonded to the lower substrate 171 at the schematically illustrated interface 173. The lower substrate 171 illustratively includes an N+ doped portion 176 and an N doped portion 177. In this case, a photolithography step (or metal mesh) would be used to define high energy proton (or other lifetime killing implants, defect generation techniques, or transition metal diffusions) so that they are laterally confined to certain regions. The region of the power device that has lifetime killing in it typically has higher forward voltage since many of the injected carriers recombine in the lifetime killing region rather than transit from anode to cathode. By laterally confining the ion implanted lifetime killing, there will be regions of the device 170 that have no recombination of carriers as they transit from the anode to the cathode, and thus this portion of the device will have low (or ideal) forward voltage.

The minority carriers that are in the base layer typically are removed from the base layer either by diffusing to the emitter-base junction or by diffusing to recombination centers. In the case that the lifetime killing implants 175 are defined laterally, then the minority carriers in the base will diffuse laterally to the short lifetime recombination region.

Since it is possible to photodefine resist that is approximately 10 μm thick to approximately 3 μm feature sizes, the lifetime killing region can consist of a grid of 2–3 μm diameter circular lifetime killing regions 175 that are buried approximately 10 μm from the prebond interface and are separated approximately every 10 μm laterally (parallel lines 2–3 μm wide separated every 10 μm is also an option). The effective distance the minority carriers then have to travel laterally to recombine is approximately 5 μm. Because of this short distance, the recombination time will be short. Thus, for the case that the lifetime killing is confined laterally, a high percentage of the injection PN junction area will not have lifetime killing, and an almost ideal turn-off time can be obtained while still achieving a fast turn-off time by having the minority carriers recombine laterally.

Experimental evidence indicates that a large fraction of helium ion implantation damage in silicon is not annealed for anneals in the 400 to 600° C. temperature range. Thus, this implantation lifetime killing damage will remain after the low temperature bonding anneal.

The above described technique of laterally confining the lifetime killing also has similar advantages for non-bonded devices such as PN diodes. It is desirable for a diode to have a low forward voltage so that it is desirable to have much of the diode area not have any lifetime killing. It is also desirable to have a fast turn-off time. Since much of the stored charge in a diode is near the PN junction, laterally confined lifetime killing regions (potentially implemented by high energy helium implant) that are approximately 4 μm to 8 μm into the N-type base from the PN junction are desirable. The lifetime killing regions that are spaced approximately 10 μm apart laterally will provide a high percentage of the area that has no lifetime killing, but will yet provide fast turn-off time by allowing the carriers to diffuse laterally approximately 5 μm to recombine laterally. Lateral confined lifetime killing also has similar advantages for a thinned IGBT in which the P+ emitter anode is formed on the backside of an IGBT or MCT device structure on the cathode side.

For IGBTs and MCTS, it may be desirable to have the lifetime killing near or in the N+ buffer. A common approach for fabricating a punchthrough IGBT is by epitaxially growing the N+ buffer and N− base layer on a P+ substrate. The processing steps for the diffusion and MOSFET control devices of the IGBT or MCT near the cathode are now performed. Because of the high temperature of the epitaxial layer growth (typically >1000° C.), lifetime killing, such as proton or HE implants or transition metal diffusion are typically performed after the epitaxial growth. There are several ion implantation lifetime killing techniques, however, than can remain as minority carrier recombination centers after the high temperature epitaxial growth. A key requirement for these lifetime killing techniques is that the ion implantation to cause defects at the surface on which epitaxial layers will be grown so that good quality epitaxial layers can be grown. One technique is to implant He ions with sufficient energy so that they are buried beneath the surface about 0.5 μm and at sufficient doses ($1 \times 10^{16}$ cm$^{-3}$) so that when the substrate is heated, the He gas expands and creates bubbles beneath the silicon surface. These bubbles will survive the epitaxial layer growth. The silicon side walls of the bubbles can then act as precipitation centers for transition metals and as recombination centers for minority carriers. The approaches to localize the lifetime killing in the lateral direction is to use a photolightographically defined resist masking layer so that the He implants can define a grind of 2–3 μm diameter circular lifetime killing regions that are buried about 0.5 μm beneath the surface on which the epitaxial layer will be grown and are separated about every 10 to 20 μm laterally. Parallel lines 2–3 μm wide may be separated every 10–20 μm as an option. The process for forming and growing the epitaxial layer and lateral lifetime killing is thus:

1. Grow an epitaxial layer including about a 10 μm thick N+ buffer and a 10 μm N− base layer on a P+ substrate.
2. Perform a photolithography step to define regions for laterally localized He implants.
3. Perform the He implant.
4. Heat to create the bubbles in the silicon.
5. Grow the remaining N− base epitaxial layer.

Alternatives to the above described process include:

1. Grow a 20 μm N− base epitaxial layer, blanket implant Arsenic for the N+ buffer, perform photolithography step for the He implant, perform the He implant, heat, and grow the remaining N− base epitaxial layer.
2. Other ion implantation lifetime killing species that can be used in a similar manner on the He implant described above are:

a.) oxygen implant to create oxygen precipitates that are buried beneath the silicon surface that will act as recombination centers. The anneal to create oxygen precipitates typically involves a long time anneal at 650° C. to nucleate the precipitates, an anneal at 950° C. to grow the precipitates, and then possibly an anneal at 1100° C. to grow stacking faults. The ion implantation dose typically required to create a high density of oxygen is typically less than about $1 \times 10^{15}$ cm$^{-3}$ and will not roughen the surface as much as is the case for the He implant that causes the bubbles.

b). Carbon implants to create carbon precipitates beneath the surface.

c). Ge implants to create lateral regions of misfit dislocations that are buried beneath the surface upon which the epitaxial layer is grown.

d). In some cases a non-laterally localized killing region of the pre-epitaxial growth lifetime killing may be desirable.

The following description relates to alternate approaches to implement: 1) an N+ buffer near the P-type body on the anode side of the device, 2) a positive temperature coefficient for forward voltage for a double-side power device, 3) the use of a silicon-on-insulator (SOI) substrate to form thin anode side and cathode side devices that need not be polished prior to bonding, and 4) electrochemical etching to form thin power device layers.

A number of power switching applications only require forward blocking operation and do not require reverse blocking operation. For this case, active device structure and field termination are required on the cathode side of the device to achieve high breakdown voltage, however, only a low breakdown voltage device is required on the anode side of the device. For this case, it is often desirable to have an N+ buffer located near the P-type emitter on the anode side of the device to achieve a higher breakdown voltage for a given total thickness of the device, to achieve a faster turn-off since many of the stored hole charges in the N− base are located within or near the N+ buffer, and to achieve negative temperature coefficient for current gain as described above.

The principle methods for implementing an N+ buffer in a double-sided device include those described herein for direct bonding after the substrates have been processed. There are several methods which are also appropriate to implementing a power switching device which is fabricated using conventional double-sided semiconductor processing.

Figure 20:
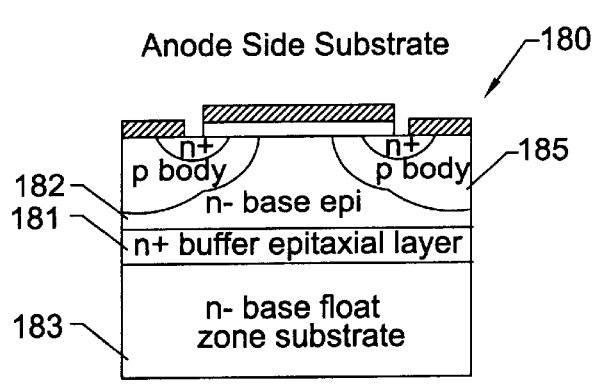
FIG. 20 is a cross-sectional view of an anode side substrate including an N+ buffer epitaxial layer in accordance with the present invention.

Epitaxial growth may be used on the anode side substrate prior to fabrication of the anode side active devices. In this approach, an epitaxial layer including an N− base layer 182 and an N+ buffer layer 181 and finally a lower doped N layer is grown on a float zone N-type substrate 183 as shown in FIG. 20. In some cases a two doping concentration buffer may be desired for robustness. The two doping concentration buffer would include the epitaxial growth of a wide, lower doping concentration N-type buffer and then a thin N+ buffer. The N+ buffer layer will generally be located about 2 μm to 20 μm from the top surface. The MOSFET current control devices located on the anode side of the device can then be fabricated within the P-type body 185 as illustrated. The P body will also form the emitter of a PNP bipolar transistor consisting of the P-type body emitter, N+ buffer/ N-type base, and P-type collector on the cathode side of the device.

Figure 21:
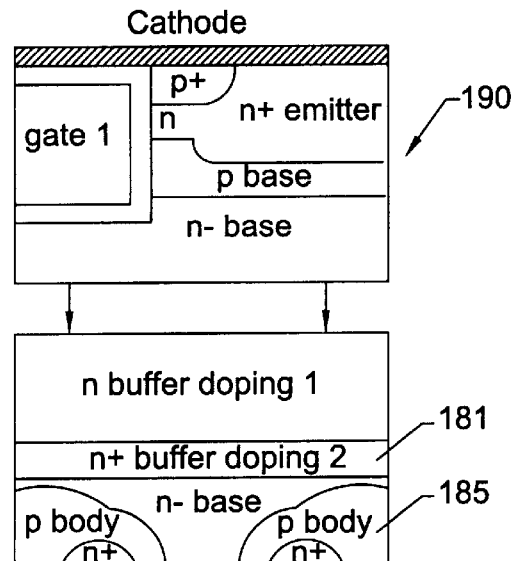
FIG. 21 is a cross-sectional view of the anode side substrate as shown in FIG. 20 after further processing and being joined to a cathode side substrate.

The direct bond approach used to fabricate a double-sided power device including the above described N+ buffer is to fabricate the anode side substrate as described above, thin to about 10 μm to 200 μm, polish and clean the surface, hydrogen terminate the surface, and then direct bond to a thinned and polished cathode side substrate 190 as shown in FIG. 21. Note that the direct bond approach can readily form the two-step N buffer as described above by having the N-type substrate concentration of the anode side substrate 180 be the desired concentration of the lower concentration N-type buffer of the two step N-type buffer. A double-sided power device with an N+ buffer near the anode side current control device can be fabricated by epitaxial growth as described above, but with the double-sided semiconductor processing instead of the direct wafer bond technique.

Figure 22:
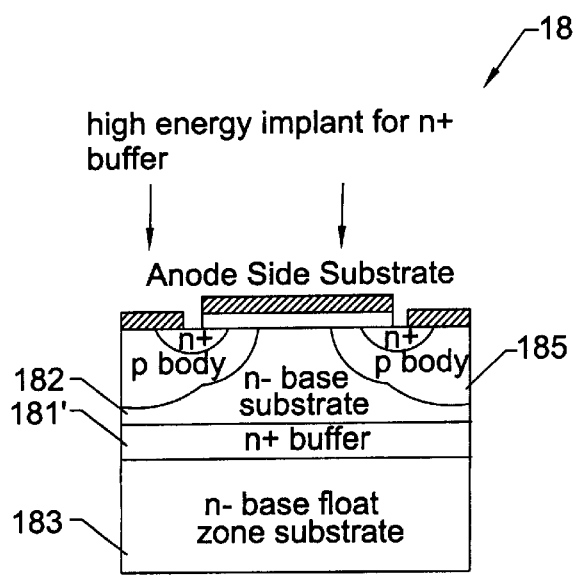
FIG. 22 is a cross-sectional view of an anode side substrate illustrating high energy implantation to form the N+ buffer layer in accordance with the present invention.
Figure 23:
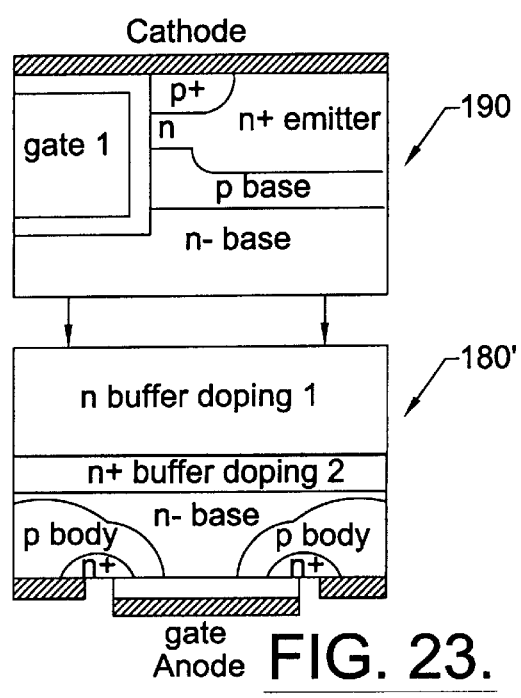
FIG. 23 is a cross-sectional view of the anode side substrate as shown in FIG. 22 after further processing and being joined to a cathode side substrate.

A high energy implant of phosphorous may be used to form the N+ buffer region 181' of the substrate 180' as shown in FIG. 22. The other portions of the substrate 180' are the same as those described above for FIGS. 20 and 21, and need no further discussion herein. FIG. 23 further illustrates the bonding of the two substrates 190, 180' and needs no further description.

Figure 24:
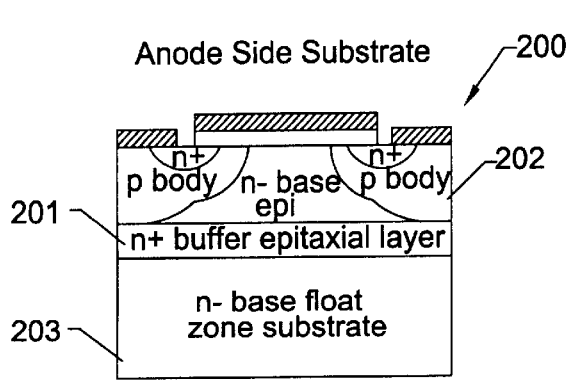
FIG. 24 is a cross-sectional view of an anode side substrate including a N+ buffer layer near the P body diffusions in accordance with the present invention.
Figure 25:
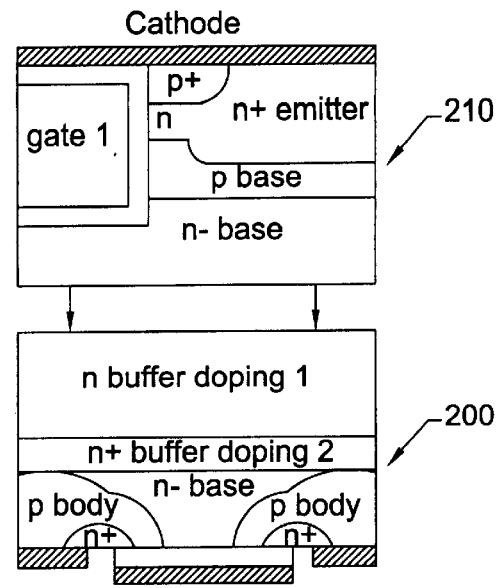
FIG. 25 is a cross-sectional view of the anode side substrate as shown in FIG. 24 after further processing being joined to a cathode side substrate.

A positive temperature coefficient for forward voltage for a double-sided power device can be obtained by having an N+ buffer concentration greater than the P-type body emitter concentration as described above. In this case it is generally desirable to have the N+ buffer layer 210 adjacent or near the P-type body 202 as shown in the anode side substrate 200 in FIG. 24. The N+ buffer layer is formed on the N− base float zone substrate portion 203. FIG. 25 illustrates the direct bonding of the thus formed anode side substrate 200 to the illustrated cathode side substrate 210.

Figure 26:
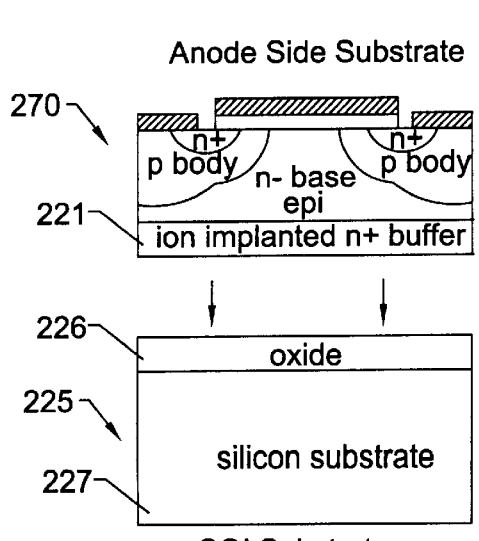
FIG. 26 is a cross-sectional view of an anode side substrate being joined to an SOI substrate in accordance with the present invention.
Figure 27:
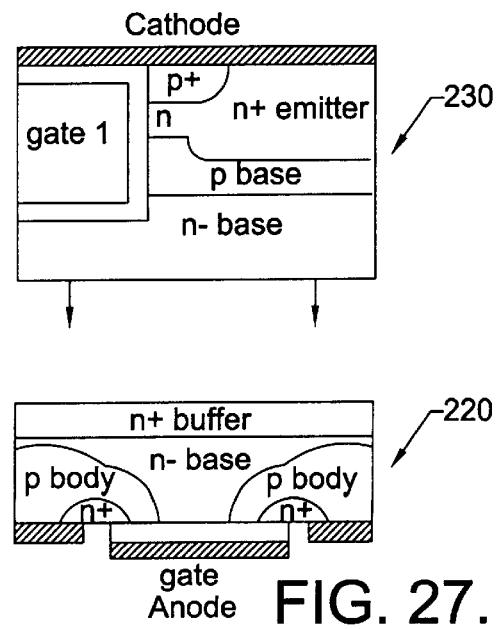
FIG. 27 is a cross-sectional view of the anode side substrate as shown in FIG. 26 being joined to a cathode side substrate.

An alternate approach to implement an N+ buffer is to use silicon-on-insulator (SOI) technology. In this approach, an N+ ion implant to form the N+ buffer 221 is made into one surface of a the anode side substrate 220 as shown in the top portion of FIG. 26. This substrate 220 will later be bonded to the silicon substrate 227 with oxide 226 on the surface thereof to form the SOI substrate 225 as shown in the lower portion of FIG. 26. The active device portion of the anode side substrate 220 is next fabricated as seen in the upper portion of FIG. 26. Prior to direct bonding to form the double-sided power device, the silicon substrate and SOI layer are removed by protecting the front surface of the wafer, grinding to within 50 μm of the oxide layer, chemically etching the silicon and stopping the etch at the oxide layer, and finally chemically etching the oxide layer. An advantage of the SOI substrate is that the surface roughness should be sufficiently small so that a polishing operation is not required. The previously fabricated anode side substrate 220 can be direct bonded to the previously fabricated cathode side substrate 230 as shown in FIG. 27.

An ion implanted N+ buffer may be formed into the prebond surface of an ultra-thin previously fabricated anode side substrate. In this approach to form an N+ buffer layer near the P body of the anode side substrate, an N+ ion implant is made into one of the prebond surface of either the anode side or cathode side substrate. It is generally desirable that the anode side substrate be about 3 μm to 20 μm thick to form the N+ buffer near the P-body. The ultra-thin anode side substrate can be implemented by the SOI approach described immediately above, grinding, and polishing, hydrogen ion implant layer splitting, and electrochemical etchstop plus polishing.

A thin anode side substrate can be formed by epitaxially growing an N-type base layer, N+ buffer, N-type base layer on a P-type substrate and forming an anode side active device as described above. In the electrochemical etch stop approach, typically the P-type substrate is etched with the etch stopping within the PN junction depletion layer. Thus, thin active side substrates can be formed. It is generally necessary that the surface be polished to obtain a small enough surface roughness to direct bond to the cathode side substrate. The electrochemical etch stop technique requires a method to make electrical contact to the front side of the device while at the same time protecting the front side of the wafer. A potential approach is to perform both functions by using a conductive polymer.

Figure 28:
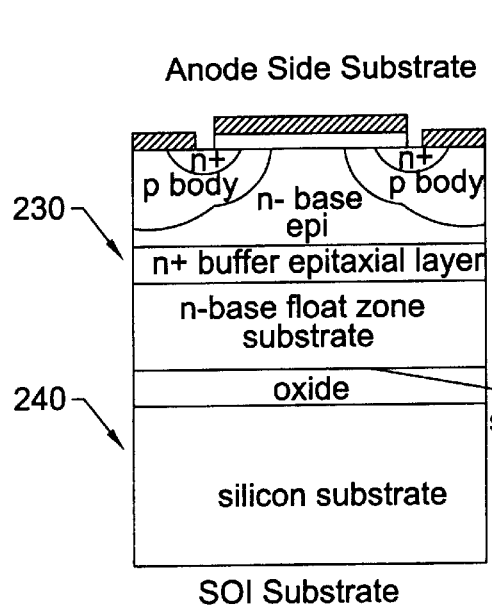
FIG. 28 is a cross-sectional view of an anode side substrate including an N+ buffer layer and base float zone mounted to an SOI substrate in accordance with the present invention.
Figure 29:
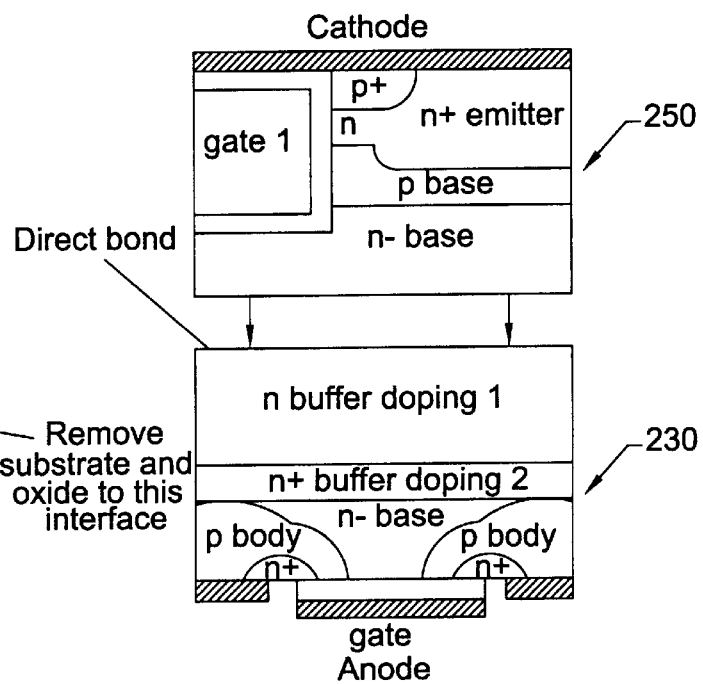
FIG. 29 is a cross-sectional view of the anode side substrate as shown in FIG. 28 after further processing and being joined to a cathode side substrate.

Another SOI approach to fabricate thin substrates for direct bonding to form a double-sided power device is to fabricate one or both sides of a double-sided power device in the top silicon layer of an SOI substrate, remove the substrate and oxide, and direct bond two previously fabricated substrates to form the device. The primary advantage of this approach is that it is not necessary to polish the prebond surface prior to direct bonding. The SOI approach to direct bonded double-sided power devices is useful whether or not an N+ buffer is included and is even useful if only forming a one sided IGBT or MCT device. In forming an SOI substrate, the typical process is to direct bond an oxidized surface of small surface roughness (<1 nm), and prime the surface finish of the silicon wafer to a silicon handle substrate. Thus, the silicon surface that is adjacent the buried oxide layer has a small surface roughness. The approach to use an SOI substrate to form a double-sided power device is then to polish the top silicon layer to the desired thickness generally in the range of about 3 to 100 μm thickness, fabricate the power switching device in the top silicon layer, remove the silicon handle substrate, remove the oxide layer, potentially ion implant into the prebond surface, and then direct bond two previously fabricated substrates to form a double-sided power switching device. This process may be better understood with reference to FIGS. 28 and 29. In FIG. 28, the anode side substrate 230 is bonded to the SOI substrate 240, and in FIG. 29, afer the SOI substrate is removed, the anode side substrate 230 is joined to the cathode side substrate 250.

As will be readily appreciated by those skilled in the art, it may also be desirable to join more than two substrates as described herein. For example, some high voltage power devices may require a silicon substrate thickness of 2 mm. This is a relatively thick substrate that can be formed by bonding together four 0.5 mm thick substrates, and with the top and bottom substrates having the processing already performed prior to bonding in accordance with the invention.

Although most of the description has discussed the formation of MOSFET control devices on one or both of the wafer surfaces, it should be understood by the inventive principles and techniques also apply to non-MOSFET current control devices, such as Gate Turn-off Thyristors, thyristors, bipolar transistors and diodes. It should further be understood that "wafer" and "substrate" have been used interchangeably herein, and that each are intended to cover single as well as multiple devices.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A method for making a semiconductor circuit from a plurality of semiconductor substrates, the method comprising the steps of:

processing at least one surface of at least one of the substrates to form at least one active device of the semiconductor circuit;

thinning at least one of the substrates;

bonding the plurality of substrates together after the processing and thinning steps so that the at least one processed surface including the at least one active device defines an outer surface of the semiconductor circuit; and annealing the bonded together substrates at an anneal temperature so as to not adversely effect the at least one active device.

2. A method according to claim 1 wherein the step of thinning comprises removing a surface portion of the least one substrate opposite the processed surface.

3. A method according to claim 1 wherein the step of thinning comprises thinning to a thickness of less than about 200 $\mu$m.

4. A method according to claim 1 further comprising the step of polishing the thinned surface to a predetermined surface roughness.

5. A method according to claim 1 further comprising the step of forming a gettering layer for the at least one substrate prior to thinning; and wherein the step of thinning comprises removing the gettering layer.

6. A method according to claim 5 wherein the step of forming the gettering layer comprises performing at least one of a phosphorous diffusion, an ion implantation of argon or carbon, and polysilicon deposition.

7. A method according to claim 5 wherein the step of forming the gettering layer comprises forming same prior to the processing step.

8. A method according to claim 1 further comprising the step of forming an implanted region at a surface of the at least one substrate opposite the processed surface prior to bonding.

9. A method according to claim 8 wherein the step of implanting comprises implanting with a lifetime killing implant.

10. A method according to claim 9 wherein the step of implanting comprises implanting in a predetermined pattern to define a plurality of laterally spaced lifetime killing implant regions.

11. A method according to claim 9 wherein the lifetime killing implant comprises at least one of protons, helium, carbon, oxygen, argon, silicon, platinum, palladium, gold, iron and nickel.

12. A method according to claim 1 further comprising the step of forming a doped layer at a surface of the at least one substrate opposite the processed surface prior to bonding.

13. A method according to claim 12 wherein the step of forming the doped layer comprises implanting a dopant into the surface.

14. A method according to claim 13 wherein the at least one substrate has a first conductivity type dopant; and wherein step of implanting a dopant comprises implanting a dopant of a second conductivity type into the doped layer at a concentration greater than a concentration of the first dopant in the substrate.

15. A method according to claim 14 further comprising the step of activating the implanted dopant.

16. A method according to claim 12 wherein the step of forming the doped layer comprises forming an epitaxial doped layer.

17. A method according to claim 1 further comprising the step of forming an epitaxial layer at a surface of the at least one substrate opposite the processed surface prior to bonding.

18. A method according to claim 17 wherein the at least one substrate comprises silicon and the epitaxial layer comprises germanium.

19. A method according to claim 1 wherein the step of processing comprises forming a highly doped buffer layer of a first conductivity type on a doped substrate of the first conductivity type.

20. A method according to claim 1 wherein the step of processing comprises implanting a highly doped buffer layer of a first conductivity type in a doped substrate of the first conductivity type.

21. A method according to claim 1 wherein the step of bonding is carried out in a vacuum.

22. A method according to claim 1 further comprising the step of mounting at least one of the substrates to be thinned onto a handling substrate prior to thinning.

23. A method according to claim 1 further comprising the step of aligning the substrates prior to bonding.

24. A method according to claim 23 wherein the step of aligning comprises:

defining predefined corresponding portions in each substrate;

cutting the substrates along the predefined portions to define cut edges; and aligning the substrates along the cut edges.

25. A method according to claim 23 further comprising the step of testing individual devices on each substrate, and aligning the substrates to increase a yield of the devices.

26. A method according to claim 1 wherein the step of processing comprises forming a metal layer; and wherein the anneal temperature is less than a temperature related to a characteristic of the metal layer.

27. A method according to claim 1 wherein the step of processing comprises forming an aluminum layer; and wherein the anneal temperature is less than about 450° C.

28. A method according to claim 1 wherein the step of processing comprises forming an aluminum layer, and forming a barrier metal between the aluminum layer and substrate; and wherein the anneal temperature is in a range of about 450 to 550° C.

29. A method according to claim 1 wherein the step of processing comprises forming at least doped region; further comprising the step of forming at least one metal layer after the annealing step; and wherein the anneal temperature is less than about 800° C.

30. A method according to claim 1 wherein the anneal temperature is greater than about 400° C.

31. A method according to claim 1 wherein the step of annealing comprises annealing for a predetermined time.

32. A method according to claim 1 wherein the substrates comprise silicon; and further comprising the step of hydrogen terminating silicon surfaces prior to the bonding step.

33. A method according to claim 1 further comprising the step of cleaning surfaces to be bonded of at least one of hydrocarbons and metals.

34. A method according to claim 1 wherein the at least one active device comprises at least one MOSFET control device.

35. A method according to claim 1 wherein the plurality of substrates is two; and wherein the processing step comprises processing both substrates.

36. A method according to claim 1 wherein the step of bonding comprises bonding at a predetermined temperature in a predetermined ambient, and with a predetermined pressure.

37. A method according to claim 1 wherein the step of annealing comprises annealing in a predetermined ambient, and with a predetermined pressure.

38. A method for making a semiconductor circuit from a plurality of semiconductor substrates, the method comprising the steps of:

forming a gettering layer for at least one of the substrates;

processing at least one surface of at least one of the substrates to form at least one active device of the semiconductor circuit;

thinning at least one of the substrates and thereby removing the at least one gettering layer;

bonding the plurality of substrates together after the processing and thinning steps so that the at least one processed surface including the at least one active device defines an outer surface of the semiconductor circuit; and annealing the bonded together substrates at an anneal temperature so as to not adversely effect the at least one active device.

39. A method according to claim 38 wherein the step of forming the gettering layer comprises performing at least one of a phosphorous diffusion, an ion implantation of argon, silicon, oxygen, or carbon, and polysilicon deposition.

40. A method according to claim 39 wherein the step of forming the gettering layer comprises forming same prior to the processing step.

41. A method according to claim 38 wherein the step of processing comprises forming a metal layer; and wherein the anneal temperature is less than a temperature related to a characteristic of the metal layer.

42. A method according to claim 38 wherein the step of processing comprises forming an aluminum layer; and wherein the anneal temperature is less than about 450° C.

43. A method according to claim 38 wherein the step of processing comprises forming an aluminum layer, and forming a barrier metal between the aluminum layer and substrate; and wherein the anneal temperature is in a range of about 450 to 550° C.

44. A method according to claim 38 wherein the step of processing comprises forming at least doped region; further comprising the step of forming at least one metal layer after the annealing step; and wherein the anneal temperature is less than about 800° C.

45. A method according to claim 38 wherein the anneal temperature is greater than about 400° C.

46. A method according to claim 38 wherein the step of processing comprises completely processing the at least one substrate to form all active devices and interconnections.

47. A method according to claim 38 wherein the at least one active device comprises at least one MOSFET control device.

48. A method for making a semiconductor circuit from a plurality of semiconductor substrates, the method comprising the steps of:

processing at least one surface of at least one of the substrates to form at least one active device of the semiconductor circuit;

implanting a region of at least one substrate opposite the processed surface;

bonding the plurality of substrates together after the processing and thinning steps so that the at least one processed surface including the at least one active device defines an outer surface of the semiconductor circuit; and annealing the bonded together substrates at an anneal temperature so as to not adversely effect the at least one active device and the implanted region.

49. A method according to claim 48 further comprising the step of thinning at least one of the substrates prior to the bonding step.

50. A method according to claim 48 wherein the step of implanting comprises implanting with a lifetime killing implant.

51. A method according to claim 50 wherein the step of implanting comprises implanting in a predetermined pattern to define a plurality of laterally spaced lifetime killing implant regions.

52. A method according to claim 51 wherein the lifetime killing implant comprises at least one of protons, helium, carbon, oxygen, argon, silicon, platinum, palladium, gold, iron and nickel.

53. A method according to claim 48 wherein the step of implanting comprises implanting a dopant into the surface.

54. A method according to claim 53 wherein the at least one substrate has a first conductivity type dopant; and wherein step of implanting a dopant comprises implanting a dopant of a second conductivity type into the doped layer at a concentration greater than a concentration of the first dopant in the substrate.

55. A method according to claim 48 wherein the step of processing comprises forming a metal layer; and wherein the anneal temperature is less than a temperature related to a characteristic of the metal layer.

56. A method according to claim 48 wherein the step of processing comprises forming an aluminum layer; and wherein the anneal temperature is less than about 450° C.

57. A method according to claim 48 wherein the step of processing comprises forming an aluminum layer, and forming a barrier metal between the aluminum layer and substrate; and wherein the anneal temperature is in a range of about 450 to 550° C.

58. A method according to claim 48 wherein the step of processing comprises forming at least doped region; further comprising the step of forming at least one metal layer after the annealing step; and wherein the anneal temperature is less than about 800° C.

59. A method according to claim 48 wherein the anneal temperature is greater than about 400° C.

60. A method according to claim 48 wherein the step of processing comprises completely processing the at least one substrate to form all active devices and interconnections.

61. A method according to claim 48 wherein the at least one active device comprises at least one MOSFET control device.

62. A method for making a semiconductor circuit from a plurality of semiconductor substrates, the method comprising the steps of:

processing at least one surface of at least one of the substrates to form at least one active device of the semiconductor circuit;

forming an epitaxial layer on a surface of at least one substrate opposite the processed surface;

bonding the plurality of substrates together after the processing and thinning steps so that the at least one processed surface including the at least one active device defines an outer surface of the semiconductor circuit; and annealing the bonded together substrates at an anneal temperature so as to not adversely effect the at least one active device.

63. A method according to claim 61 further comprising the step of thinning at least one of the substrates prior to the bonding step.

64. A method according to claim 61 wherein the step of forming an epitaxial layer comprises forming an epitaxial doped layer to define a relatively thin buffer layer.

65. A method according to claim 64 wherein the step of forming the doped epitaxial layer comprises forming same to have a dopant concentration greater than an adjacent substrate portion.

66. A method according to claim 62 wherein the at least one substrate comprises silicon and the epitaxial layer comprises germanium.

67. A method according to claim 62 wherein the step of processing comprises forming a metal layer; and wherein the anneal temperature is less than a temperature related to a characteristic of the metal layer.

68. A method according to claim 62 wherein the step of processing comprises forming an aluminum layer; and wherein the anneal temperature is less than about 450° C.

69. A method according to claim 62 wherein the step of processing comprises forming an aluminum layer, and forming a barrier metal between the aluminum layer and substrate; and wherein the anneal temperature is in a range of about 450 to 550° C.

70. A method according to claim 62 wherein the step of processing comprises forming at least doped region; further comprising the step of forming at least one metal layer after the annealing step; and wherein the anneal temperature is less than about 800° C.

71. A method according to claim 62 wherein the anneal temperature is greater than about 400° C.

72. A method according to claim 62 wherein the step of processing comprises completely processing the at least one substrate to form all active devices and interconnections.

73. A method according to claim 62 wherein the at least one active device comprises at least one MOSFET control device.

74. A method for making a semiconductor circuit from a plurality of semiconductor substrates, the method comprising the steps of:

processing at least one surface of at least one of the substrates to form at least one active device of the semiconductor circuit;

implanting a region of at least one substrate opposite the processed surface in a predetermined pattern to define a plurality of laterally spaced lifetime killing implant regions;

bonding the plurality of substrates together after the processing and thinning steps so that the at least one processed surface including the at least one active device defines an outer surface of the semiconductor circuit; and annealing the bonded together substrates at an anneal temperature so as to not adversely effect the at least one active device and the implanted regions.

75. A method according to claim 74 further comprising the step of thinning at least one of the substrates prior to the bonding step.

76. A method according to claim 75 wherein the lifetime killing implant comprises at least one of protons, helium, carbon, oxygen, argon, silicon, platinum, palladium, gold, iron and nickel.

77. A method according to claim 74 wherein the step of processing comprises forming a metal layer; and wherein the anneal temperature is less than a temperature related to a characteristic of the metal layer.

78. A method according to claim 74 wherein the step of processing comprises forming an aluminum layer; and wherein the anneal temperature is less than about 450° C.

79. A method according to claim 62 wherein the step of processing comprises forming an aluminum layer, and forming a barrier metal between the aluminum layer and substrate; and wherein the anneal temperature is in a range of about 450 to 550° C.

80. A method according to claim 74 wherein the step of processing comprises forming at least doped region; further comprising the step of forming at least one metal layer after the annealing step; and wherein the anneal temperature is less than about 800° C.

81. A method according to claim 74 wherein the anneal temperature is greater than about 400° C.

82. A method according to claim 74 wherein the step of processing comprises completely processing the at least one substrate to form all active devices and interconnections.

83. A method according to claim 74 wherein the at least one active device comprises at least one MOSFET control device.

* * * * *